(12) United States Patent
Matsuzaki

(10) Patent No.: US 7,955,872 B2
(45) Date of Patent: Jun. 7, 2011

(54) MANUFACTURING METHOD OF SEMICONDUCTOR INTEGRATED CIRCUIT DEVICE USING MAGNETIC MEMORY

(75) Inventor: Nozomu Matsuzaki, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 12/686,954

(22) Filed: Jan. 13, 2010

(65) Prior Publication Data

US 2010/0184239 A1   Jul. 22, 2010

(30) Foreign Application Priority Data

Jan. 19, 2009   (JP) ................. 2009-008855

(51) Int. Cl.
*H01L 21/00* (2006.01)
*H01L 21/20* (2006.01)
*H01L 21/8234* (2006.01)
*H01L 21/8244* (2006.01)

(52) U.S. Cl. ............ 438/3; 438/238; 438/239; 438/256; 438/381; 438/399; 257/E21.582; 257/E21.584; 257/E21.665

(58) Field of Classification Search ........... 257/E21.665, 257/E21.584, E21.582
See application file for complete search history.

(56) References Cited

U.S. PATENT DOCUMENTS

| 7,468,542 B2 | 12/2008 | Hayakawa et al. |
| 2003/0203510 A1* | 10/2003 | Hineman et al. ............. 438/3 |
| 2005/0160585 A1* | 7/2005 | Kim ................. 29/603.01 |
| 2006/0022237 A1* | 2/2006 | Byun et al. ................. 257/295 |

FOREIGN PATENT DOCUMENTS

JP   2005-116888 A   4/2005

* cited by examiner

*Primary Examiner* — Savitri Mulpuri
*Assistant Examiner* — Mohsen Ahmadi
(74) *Attorney, Agent, or Firm* — Miles & Stockbridge, P.C.

(57) ABSTRACT

In the case where a laminated structure formed by laminating tunneling magnetoresistive films are processed by ion milling or the like, scattered substances of a material constituting the tunneling magnetoresistive film are deposited onto side walls of the laminated structure, or contaminate the inside of a device for processing. Accordingly, it has been difficult to manufacture a magnetic memory or a semiconductor device on which the magnetic memory is mounted, with stable characteristics.

Side wall spacers are formed on side walls of a conductive layer arranged above a tunneling magnetoresistive film, and scattered substances of a material constituting the tunneling magnetoresistive film during processing are deposited. Thereafter, by removing the side wall spacers, the redepositions of the material are also removed. The side wall spacers used are of one kind or two kinds.

18 Claims, 21 Drawing Sheets

MANUFACTURING METHOD OF SEMICONDUCTOR INTEGRATED CIRCUIT DEVICE USING MAGNETIC MEMORY

CLAIM OF PRIORITY

The present application claims priority from Japanese patent application JP 2009-008855 filed on Jan. 19, 2009, the content of which is hereby incorporated by reference into this application.

BACKGROUND OF THE INVENTION (1) Field of the Invention

The present invention relates to a manufacturing method of a magnetic memory that is useful to be mounted on a semiconductor integrated circuit device, and a manufacturing method of the semiconductor integrated circuit device. In particular, the magnetic memory is useful as a non-volatile memory to be mounted on a semiconductor integrated circuit device having a CMOS (complementary MOSFET).

(2) Description of the Related Art

Development of a technique of incorporating a memory using a magnetic material into a semiconductor integrated circuit device has recently been advanced. In particular, in a method of programming a magnetic memory using spin transfer, miniaturization leads to reduction of programming current. Thus, the magnetic memory can be easily adapted to scaling of a semiconductor device, and is expected as a new memory device.

A spin-transfer torque memory utilizes the TMR (Tunnel Magneto-Resistance) effect. The memory is characterized in that a laminated film (hereinafter, referred to as a TMR laminated film) of a dielectric layer (tunnel film) and plural magnetic materials is used. The TMR laminated film is a complicated film formed by laminating various materials. Accordingly, in order to process the TMR laminated film, it is necessary to adapt an ion milling method in which a high-energy ion is applied to a target object for physical etching, without adapting an RIE (Reactive ion etching) method used in normal manufacturing of a semiconductor. The ion milling is an etching method in which a chemical reaction with a target object is not used, and is suitable for processing a wide range of materials. In particular, the ion milling is a technique which has been used for processing a memory using a magnetic material.

U.S. Pat. No. 7,468,542 and Japanese Patent Application Laid-Open publication No. 2005-116888 are such examples.

In the process of the TMR laminated film, the ion milling is disadvantageous in the following points. Specifically, an etching target is redeposited in a film shape onto side walls of a processed pattern. In the case where a magnetic memory is mounted on a semiconductor integrated circuit device, scattering and redepositing of the etching target causes contamination of a semiconductor manufacturing device and a manufacturing line. As a result, scattering and redepositing of the etching target becomes a problem in securing stable characteristics of a magnetic memory, a semiconductor device, and a semiconductor integrated circuit device to be manufactured.

A specific problem will be described with a structure example of a typical spin-transfer torque memory. FIGS. 19 to 21 are cross sectional views, each schematically showing a main part of a magnetic memory immediately after a hard mask is formed by ion milling using a resist (photo resist) as a mask.

FIG. 19 shows a state after a hard mask/upper electrode lead layer HMM is completely processed. Specifically, an inter-wiring-layer electrode plug PLUG is provided in a dielectric film INS1 formed on a substrate, and a lower electrode layer BM, a magnetic laminated film TMR, and an upper electrode film UM which constitute a magnetic memory are laminated thereabove. On a certain portion of the upper electrode film UM, the hard mask/upper electrode lead layer HMM and a resist RES used for processing are provided. FIG. 19 shows a state immediately after forming the hard mask HMM by ion milling RIE using the resist RES as a mask. The reference numerals of the same constituent elements in FIGS. 19 to 21 are not repeatedly shown, and only new constituent elements and constituent elements necessary for explanation are shown.

FIG. 20 shows a state in which the resist RES used for processing is removed in the state of FIG. 19, and the upper electrode UM and the magnetic laminated film TMR are processed by applying ion milling using the hard mask HMM as a mask. In FIG. 20, redepositions REDEP which are mainly composed of the upper electrode film UM and contain some component of the magnetic laminated film TMR are deposited in a film shape onto side walls of the hard mask HMM. The redepositions REDEP are generated due to the process itself of ion milling, and thus, it is difficult to remove the same after deposition.

FIG. 21 shows a state in which further steps are performed from the state of FIG. 20. An interlayer dielectric film INS2 is laminated on the entire surface of the structure of FIG. 20. Thereafter, CMP (Chemical Mechanical Polishing) is performed to planarize the surface of the substrate before formation of wiring, and an upper end surface of the hard mask HMM is exposed. At this time, the redepositions REDEP as well as the upper surface of the hard mask HMM are exposed, and are polished together with the interlayer dielectric film INS2 and the hard mask HMM in a CMP device. Such polishing causes contamination of the CMP device itself due to spread of a magnetic material contained in the redepositions REDEP within the CMP device. If the manufacturing steps are continued, the contamination is spread to a device for laminating a wiring layer BL. The contamination leads to a serious problem in a line for manufacturing a semiconductor integrated circuit device such as a CMOS. It is necessary to remove the redepositions on the side walls of the hard mask HMM caused by the ion milling before the interlayer dielectric film INS2 is laminated.

The present invention is to provide a manufacturing method of a magnetic memory in which depositions deposited onto side walls of a hard mask can be removed before a CMP process, and a manufacturing method of a semiconductor integrated circuit device on which the magnetic memory is mounted.

SUMMARY OF THE INVENTION

A first manufacturing method of a magnetic memory according to an aspect of the present invention includes the following steps. The main point is to form undercut shapes under first side wall spacers. Specifically, the present invention provides a manufacturing method of a magnetic memory including the steps of: sequentially forming a first conductive layer, a laminated film having a magnetic memory function, a second conductive layer, a third conductive layer, and a fourth conductive layer on a substrate; processing the fourth conductive layer into a predetermined shape; forming a first side wall spacer material layer while covering at least the processed fourth conductive layer; forming first side wall spacers while the first side wall spacer material layers formed on side walls of the fourth conductive layer are left and the remainder is removed; forming undercut shapes under the first side wall spacers while removing areas of the third conductive layer exposed on an upper surface of the substrate prepared in the above-described steps and areas corresponding to lower portions of the first side wall spacers; etching the second conductive layer and the laminated film having a magnetic memory function by ion milling using the fourth conductive layer and the first side wall spacers as mask areas; removing the first side wall spacers formed on the side walls of the fourth conductive layer; forming a dielectric film on the surface of the substrate prepared in the above-described steps; exposing, after the dielectric film is planarized by polishing, the processed fourth conductive layer on an upper surface of the dielectric film; and forming a fifth conductive layer which is electrically coupled to at least the fourth conductive layer.

In this case, it is preferable in practical use that the first side wall spacer material layer is a silicon-oxide film. Specifically, manufacturing of a magnetic memory is extremely useful in continuity with the manufacturing steps of a semiconductor integrated circuit device, or in sharing of a manufacturing device.

Further, it is important that the third conductive layer is a conductive layer by which the second and fourth conductive layers can be selectively removed.

A second manufacturing method of a magnetic memory according to an aspect of the present invention includes the following steps. Unlike the first manufacturing method of a magnetic memory, first side wall spacers and second side wall spacers are used. Specifically, the present invention provides a manufacturing method of a magnetic memory including the steps of: forming a first conductive layer, a laminated film having a magnetic memory function, a second conductive layer, and a fourth conductive layer on a substrate; processing the fourth conductive layer into a predetermined shape; forming a first side wall spacer material layer while covering at least the processed fourth conductive layer and an upper surface of the second conductive layer adjacent to the fourth conductive layer; forming a second side wall spacer material layer on the first side wall spacer material layer; forming first side wall spacers and second side wall spacers after areas of the first side wall spacer material layer and the second side wall spacer material layer corresponding to side walls of the fourth conductive layer are left and the remainder is removed; forming undercut shapes between the first and second side wall spacers and the second conductive layer after removing parts of upper end portions and lower end portions of the first side wall spacers relative to the substrate; etching the second conductive layer and the laminated film having a magnetic memory function by ion milling using the fourth conductive layer, the first side wall spacers and the second side wall spacers as mask areas; removing the second side wall spacers as well as the first side wall spacers formed on the side walls of the fourth conductive layer; forming a dielectric film on a surface of the substrate prepared in the above-described steps; exposing, after the dielectric film is planarized by polishing, the fourth conductive layer on an upper surface of the dielectric film; and forming a fifth conductive layer which is electrically coupled to at least the fourth conductive layer.

It is an important point in the step of forming the first side wall spacers and the second side wall spacers that the first side wall spacers and the second side wall spacers are formed in such a manner that lower ends of the second side wall spacers are mounted on upper portions of areas where the first side wall spacers extend on the second conductive layer.

In this case, it is extremely useful in practical use that the first side wall spacer material layer is a silicon-oxide film, and the second side wall spacer material layer is a silicon nitride film. Specifically, as similar to the first method, manufacturing of a magnetic memory is extremely useful in continuity with the manufacturing steps of a semiconductor integrated circuit device, or in sharing of a manufacturing device.

Further, it is important that the material of the first side wall spacers can selectively remove the material of the second side wall spacers. This matter is necessary to form the undercut shapes under the first side wall spacers.

Next, there will be described a manufacturing method of a structure in which the magnetic memory is mounted on a semiconductor integrated circuit device, namely, a semiconductor integrated circuit device having the magnetic memory.

A semiconductor substrate in which a semiconductor integrated circuit is formed and on a surface of which a conductive layer electrically coupled to the semiconductor integrated circuit is exposed is prepared, and at least the conductive layer exposed on the surface of the semiconductor substrate is covered to perform the above-described manufacturing steps of a magnetic memory on the semiconductor substrate. It is obvious that the above-described two basic manufacturing methods of a magnetic memory can be applied. The steps after preparing the semiconductor substrate are the same as those in the above-described manufacturing method of a magnetic memory, and thus, the detailed description thereof will be omitted.

It is extremely useful from the view point of practical use that the semiconductor integrated circuit includes a complementary MOSFET (CMOS). This is because a circuit technique or a structural technique of a conventional semiconductor device or a semiconductor integrated circuit device can be used.

It should be noted the laminated film having a magnetic memory function will be concretely described in the section of "DETAILED DESCRIPTION OF THE EMBODIMENT".

According to the present invention, it is possible to manufacture a magnetic memory with a laminated film having a magnetic memory function or a semiconductor device using the magnetic memory, with stable characteristics.

BRIEF DESCRIPTION OF THE DRAWINGS

Exemplary embodiments of the present invention will be described in detail based on the following figures, wherein.

DETAILED DESCRIPTION OF THE EMBODIMENT

Figure 1:
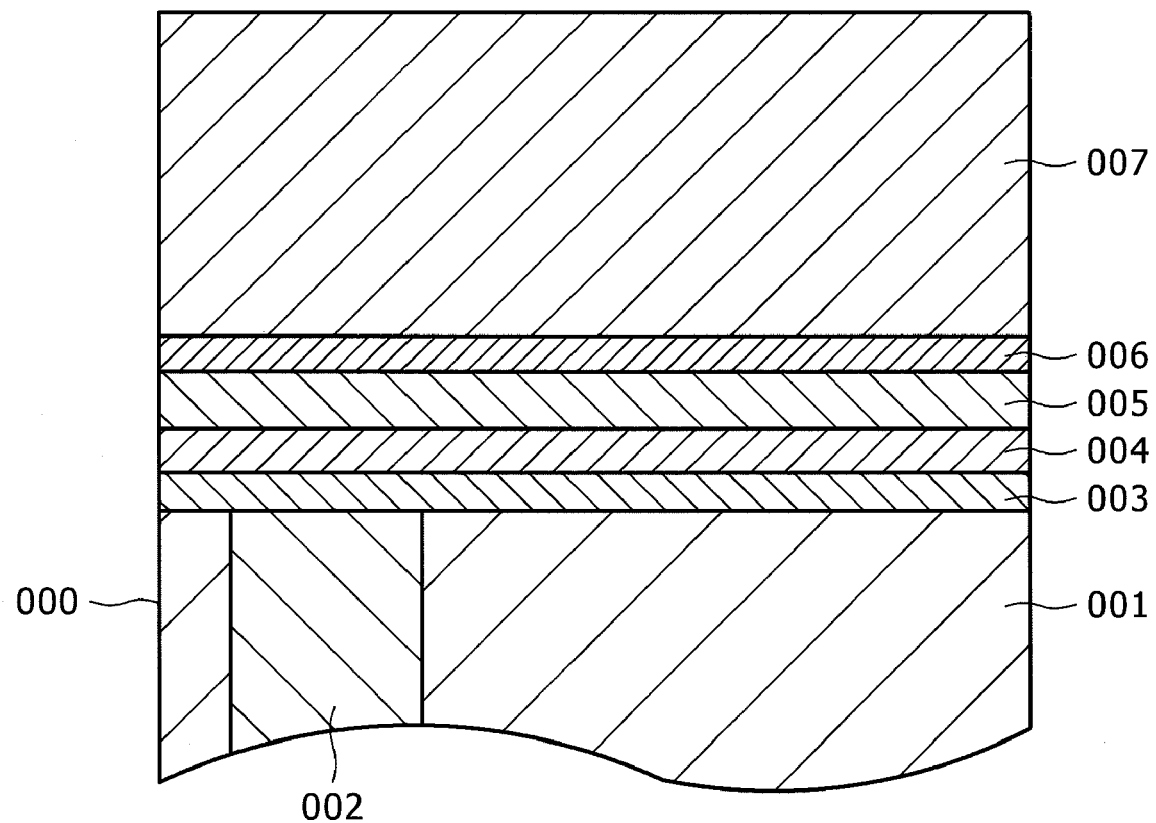
FIG. 1 is a cross sectional view for explaining a manufacturing step according to a first embodiment of the present invention.

A first embodiment of the present invention will be described using FIG. 1 to FIG. 8. Here, steps related to manufacturing of a memory using a magnetic material will be shown as a main point of the present invention. Such a magnetic memory using a magnetic material is mounted for use on a semiconductor device, or a semiconductor integrated circuit in many cases. The entire configuration will be described later.

The first embodiment corresponds to the first manufacturing method of a magnetic memory described as basic steps.

Specifically, the first embodiment provides a manufacturing method of a magnetic memory including the steps of: sequentially forming a first conductive layer, a laminated film having a magnetic memory function, a second conductive layer, a third conductive layer, and a fourth conductive layer on a substrate; processing the fourth conductive layer into a predetermined shape; forming a first side wall spacer material layer while covering at least the processed fourth conductive layer; forming first side wall spacers while the first side wall spacer material layers formed on side walls of the fourth conductive layer are left and the remainder is removed; forming undercut shapes under the first side wall spacers while removing areas of the third conductive layer exposed on an upper surface of the substrate prepared in the above-described steps and areas corresponding to lower portions of the first side wall spacers; etching the second conductive layer and the laminated film having a magnetic memory function by ion milling using the fourth conductive layer and the first side wall spacers as mask areas; removing the first side wall spacers formed on the side walls of the fourth conductive layer; forming a dielectric film on the surface of the substrate prepared in the above-described steps; exposing, after the dielectric film is planarized by polishing, the processed fourth conductive layer on an upper surface of the dielectric film; and forming a fifth conductive layer which is electrically coupled to at least the fourth conductive layer.

As the substrate used in manufacturing of a magnetic memory, a dielectric substrate having a conductive layer on a surface can be used. However, a semiconductor device substrate incorporating a semiconductor device or a semiconductor integrated circuit can be applied. In this case, a magnetic memory is electrically coupled to the semiconductor device or the semiconductor integrated circuit device, so that the semiconductor device or the semiconductor integrated circuit device having a memory function can be realized. The semiconductor integrated circuit device as a substrate includes a logic circuit serving as a complementary MOSFET (CMOS), and a non-volatile memory having a magnetic memory can be accordingly realized as described above.

There will be described a correspondence relation between designations of main constituent elements in the concrete embodiments that will be described later and concepts of the basic steps. Giving names of concrete roles to the respective constituent elements in the embodiment leads to easy understanding of concretization of the structure, and thus, the designations will be used.

Semiconductor substrate 000: substrate
plug electrode 002: conductive layer which is electrically coupled to a semiconductor integrated circuit
lower electrode conductive layer 003: first conductive layer
TMR laminated film 004: laminated film having a magnetic memory function
upper electrode layer 005: second conductive layer
intermediate conductive layer 006: third conductive layer
hard mask conductive material 007: fourth conductive layer
first spacer material 009
wiring 012: fifth conductive layer Here, as a main material for the plug electrode 002 having an exposed surface on a silicon-oxide film 001, W is generally used. The TMR laminated film (laminated film having a magnetic memory function) 004 is the designation of a tunneling magnetoresistive laminated film. This is generally referred to as a tunneling magnetoresistive film. Such a film itself has been well known to date, and a representative example thereof is known as a tunnel film structured as ferromagnetic film/dielectric film/ferromagnetic film in which a tunnel resistance is changed in accordance with the magnetization directions of two ferromagnetic films. For this basic structure, various modifications have been proposed. The gist of the present invention is to use the tunneling magnetoresistive laminated film (tunneling magnetoresistive film), and it is obvious that various modifications and modified structures for the basis structure can be used in the present invention. The present invention is based on using the tunneling magnetoresistive film. However, the present invention relates to a wiring structure and a wiring method in the case of using the tunneling magnetoresistive film, and thus, the detailed description of the tunneling magnetoresistive film itself will be omitted. This is also applied to a case in a second embodiment to be described later.

It should be noted that Japanese Patent Application Laid-Open publication No. 2007-59879 described above is an example of the tunneling magnetoresistive film.

For the first conductive layer corresponding to the lower electrode layer 003, at least one selected from a group of Ta, TiN, and Ru which are heat-resistant metals can be generally used. For the second conductive layer corresponding to the upper electrode layer 005, TiN is generally used. The material of the intermediate conductive layer 006, W is generally used. For the upper electrode layer, the intermediate conductive layer, and the lower electrode layer, a combination of materials is used on the basis of conditions under which a selection ratio can be taken based on dry etching. For example, TiN/W/TiN and W/TiN/W are representative examples as upper electrode layer/intermediate conductive layer/upper electrode layer. It should be noted that Ru which is not suitable for a step of exposing an electrode surface by CMP is not used for the hard mask conductive material 007. As the material of the third conductive layer corresponding to the intermediate conductive layer 006, it is necessary to select a material which can be selectively processed for the materials of the upper electrode layer 005 and the hard mask conductive material 007. The reason for this will be described later. For the fifth conductive layer, Al, AlSi, or W is generally used.

The thickness of each conductive layer is roughly selected from the following ranges. Specifically, the thickness of the first conductive layer falls within a range of 20 to 30 nm, the thickness of the second conductive layer falls within a range of 20 to 30 nm, the thickness of the third conductive layer falls within a range of 10 to 30 nm, the thickness of the fourth conductive layer falls within a range of 50 to 200 nm, and the thickness of the fifth conductive layer falls within a range of 150 to 400 nm. In addition, the thickness of the TMR laminated film (laminated film having a magnetic memory function) roughly falls within a range of 15 to 30 nm.

Next, a manufacturing step according to the first embodiment of the present invention will be concretely described. It should be noted that a semiconductor substrate having a semiconductor integrated circuit device will be described as an example. However, it is obvious that a magnetic memory can be simply manufactured using a dielectric substrate having a conductive layer on its surface as described above. Accordingly, the explanation thereof will be omitted.

FIG. 1 shows a state in which the lower electrode layer 003, the TMR laminated film 004, the upper electrode layer 005, the intermediate conductive layer 006, and the hard mask conductive material 007 are sequentially laminated and deposited on the silicon-oxide film 001 provided on the semiconductor substrate 000. Further, upper surfaces of the silicon-oxide film 001 and the plug electrode 002 are planarized using a normal CMP technique. The silicon-oxide film 001 is a silicon-oxide film formed by CVD (chemical vapor deposition), and corresponds to an inter-wiring-layer film of a semiconductor integrated circuit device. The plug electrode penetrating through such an inter-wiring-layer film is formed according to a manufacturing method of a normal silicon semiconductor integrated circuit device. It is possible to prepare a special substrate in the present invention. However, a substrate itself for the conventional silicon semiconductor integrated circuit device can be used. Thus, the description of the manufacturing method of the silicon semiconductor integrated circuit device itself, other than a wiring portion for the magnetic memory, will be omitted in the present invention. It should be noted that a representative example of the structure of the semiconductor integrated circuit device according to the present invention as well as the semiconductor integrated circuit will be exemplified later.

Figure 2:
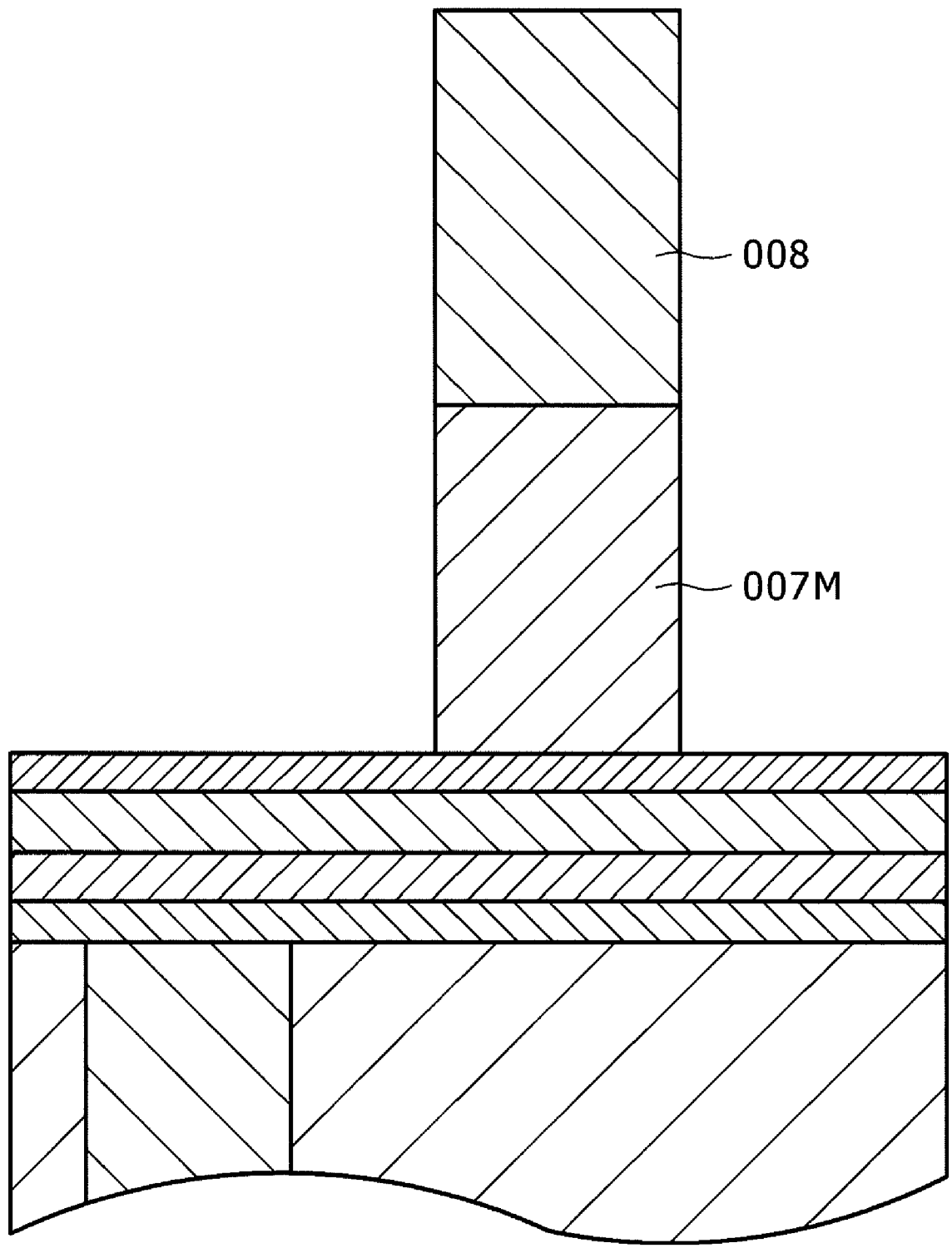
FIG. 2 is a cross sectional view for explaining a manufacturing step according to the first embodiment of the present invention.

FIG. 2 shows a state in which the state of FIG. 1 is processed using a normal lithography technique. A resist 008 (a normal photo resist may be used) is formed as a mask, and the hard mask conductive material layer 007 is processed to the shape represented by the reference numeral 007M using a normal dry etching technique. In FIG. 2, only a cross section of the hard mask conductive material layer 007M is shown. Representative examples of a plane shape include a rectangular shape, a circular shape, and an oval shape. For example, the size of a rectangular shape is 100 nm square, and the size of a circular or oval shape is 100 nm in diameter or minor axis. The hard mask conductive material layer 007M plays a role as a mask when being processed, and also plays a role as a conductor to an upper wiring after completion of the device.

Figure 3:
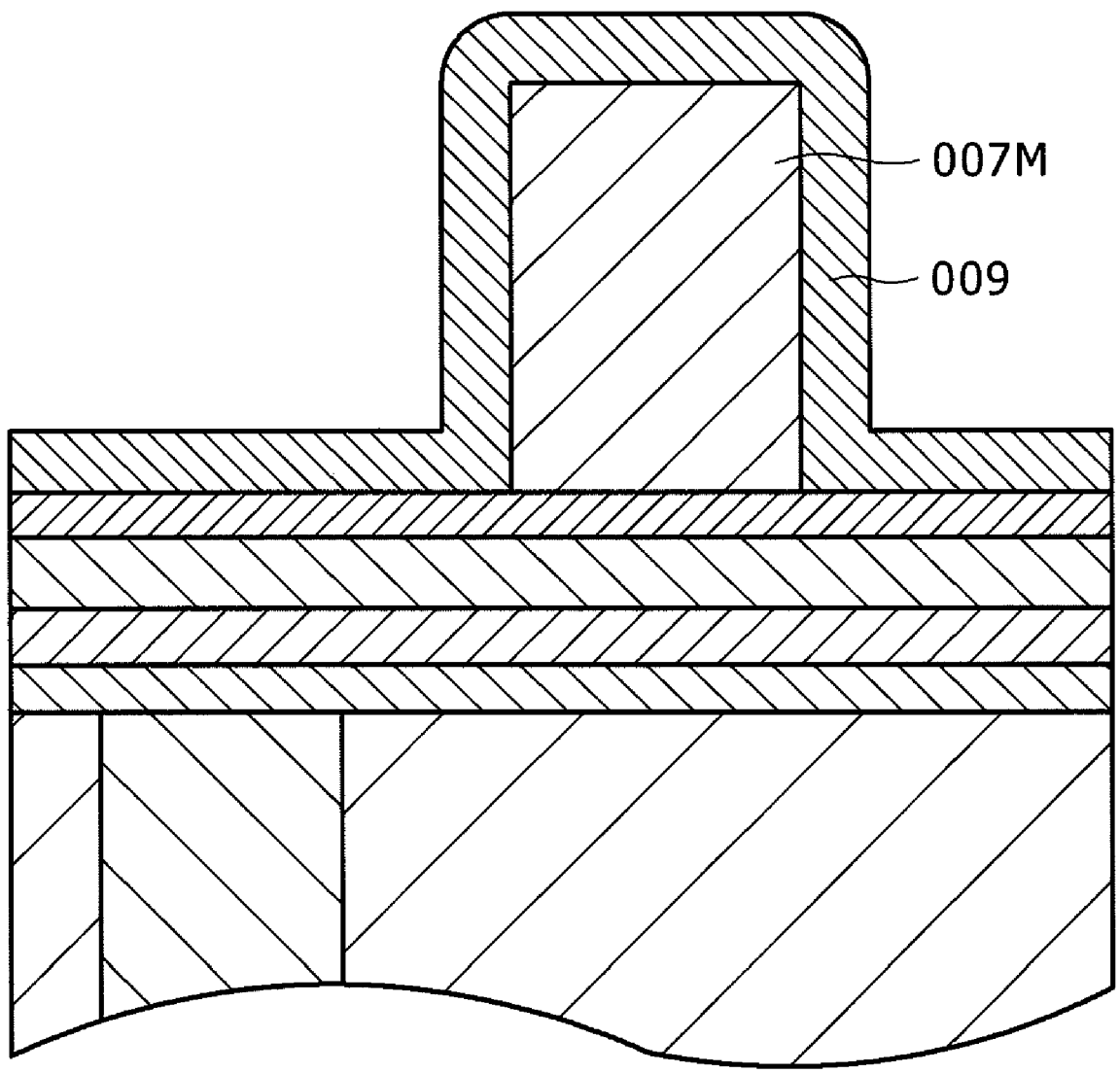
FIG. 3 is a cross sectional view for explaining a manufacturing step according to the first embodiment of the present invention.

FIG. 3 is a cross sectional view in which after removing the resist mask 008, a silicon-oxide film that is the first spacer material 009 is deposited on the entire surface. The thickness of the spacer material 009 is, for example, 30 nm. A film thickness of 30 to 5 nm is practical. If the film thickness is too large, the mask size is remarkably increased. On the other hand, the lower limit of the film thickness is up to the limit of deposition of a thin film by the CVD method.

Figure 4:
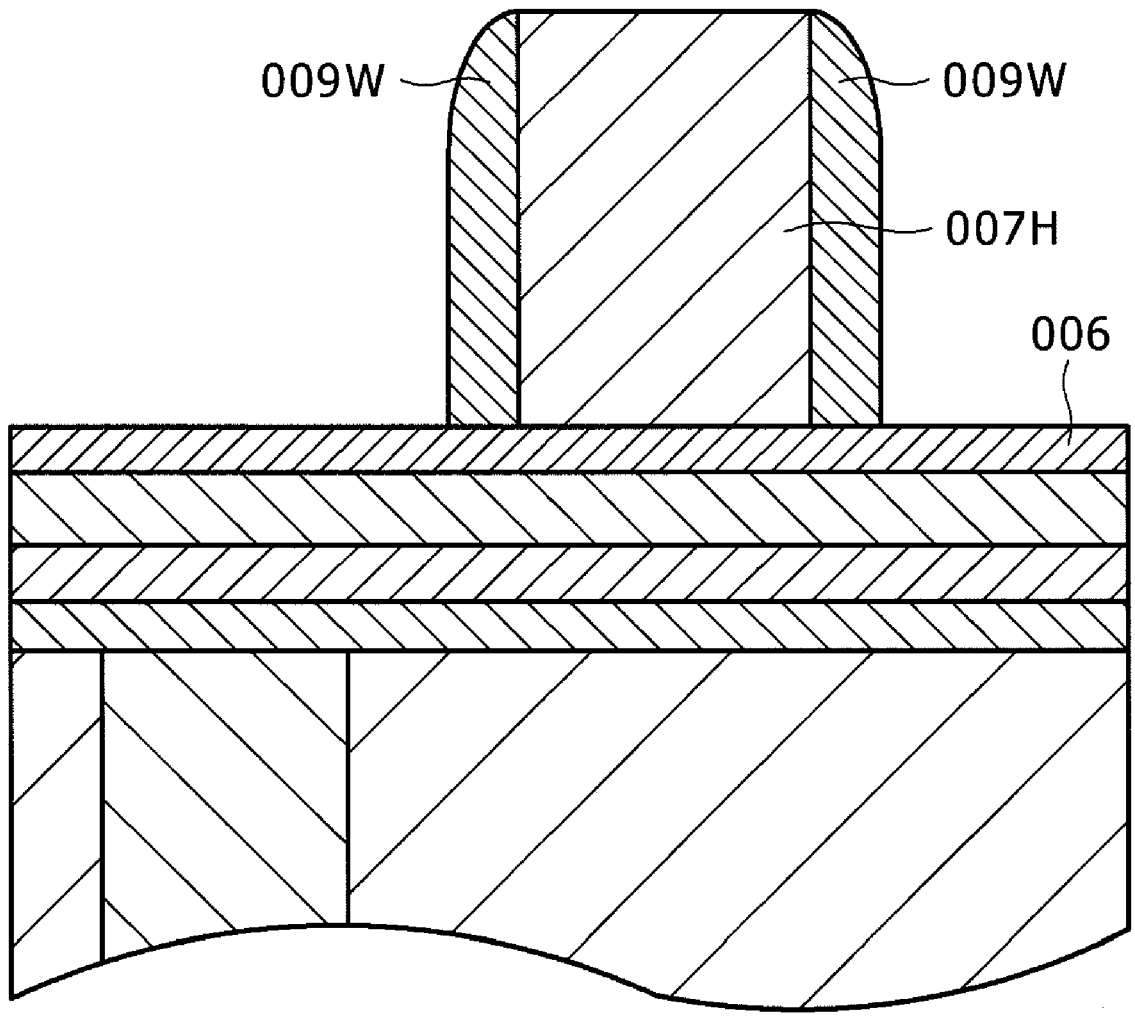
FIG. 4 is a cross sectional view for explaining a manufacturing step according to the first embodiment of the present invention.

FIG. 4 shows a state in which anisotropic etching is performed at the stage of FIG. 3 where the silicon-oxide film 009 is laminated, and side wall spacers 009M are formed on side walls of the hard mask conductive material layer 007M. In the material layer (silicon-oxide film 009) for first side wall spacers, the material layers for the first side spacers formed on the side walls of the fourth conductive layer (hard mask conductive material layer 007M) are left, and the remainder is removed. The formation method itself of such side wall spacers is a normal method same as that of a gate electrode side wall spacer of MOSFET.

Figure 5:
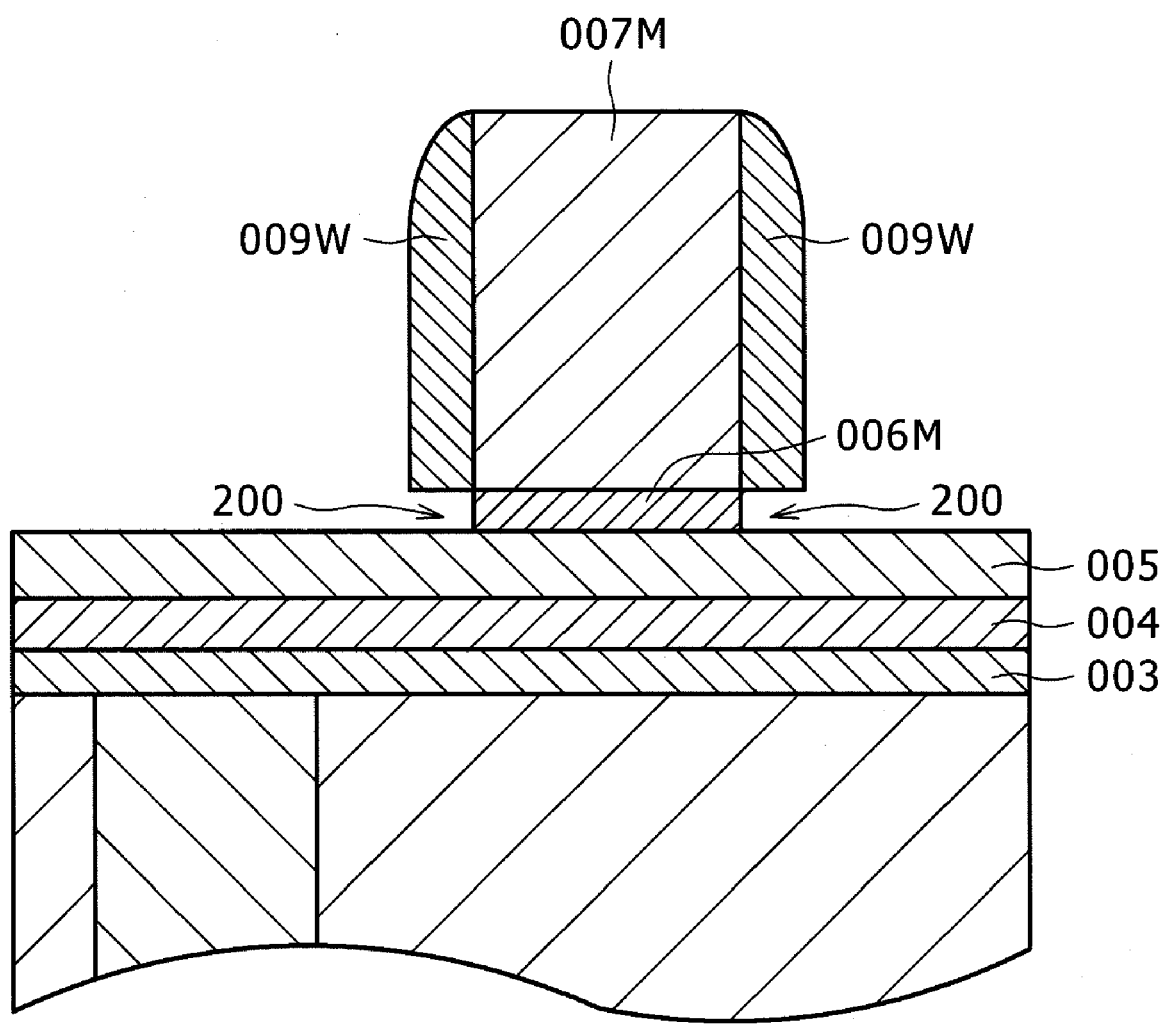
FIG. 5 is a cross sectional view for explaining a manufacturing step according to the first embodiment of the present invention.

FIG. 5 is a cross sectional view after performing isotropic etching for removing the intermediate conductive layer 006 (third conductive layer) in the state of FIG. 4. Specifically, areas of the third conductive layer (intermediate conductive layer 006) exposed on the upper surface of the substrate prepared in the above-described steps and areas corresponding to lower portions of the first side wall spacers 009W are removed to form undercut shapes under the first side wall spacers 009W. The isotropic etching is performed in accordance with, for example, a dry etching method. Under the hard mask conductive material layer 007M, the intermediate conductive layer 006 that is not removed is left as an intermediate conductive processed film 006M, and undercut shapes 200 are formed under the first side wall spacers 009M. The main point of the step is to provide the undercut shapes 200 under the first side wall spacers 009W. The reason and effects for this will be described using FIG. 6.

Figure 6:
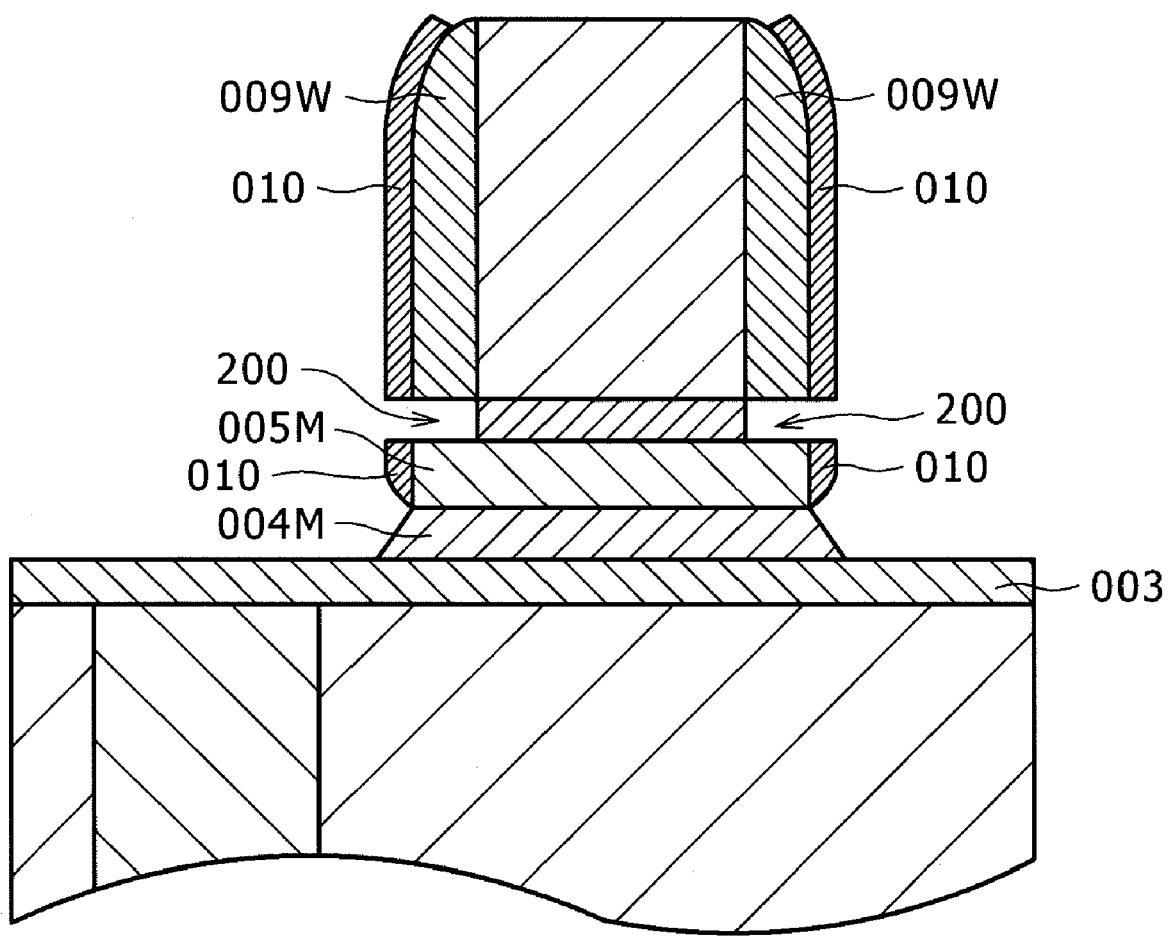
FIG. 6 is a cross sectional view for explaining a manufacturing step according to the first embodiment of the present invention.

FIG. 6 is a cross sectional view showing a state after being processed into the shapes of an upper electrode layer 005M (second conductive layer) and a TMR laminated film 004M (laminated film having a magnetic memory function). Specifically, after completion of the shape of FIG. 5, the upper electrode layer 005 is perpendicularly processed to be shaped as the upper electrode layer 005M and the TMR laminated film 004 is obliquely processed to be shaped as the TMR laminated film 004M by an ion milling method using the resist mask 007 and the first side wall spacers 009W as masks.

As described in the section of "BACKGROUND OF THE INVENTION", there occurs a phenomenon that substances to be etched are deposited onto the side walls again at the time of ion milling. The reference numeral 010 denotes redepositions which are mainly composed of the component of the upper electrode layer 005. Further, the substance includes the component of the TMR laminated film 004. In the example, the redepositions 010 can be divided at the regions of the undercuts 200 formed in the state of FIG. 5, as shown in FIG. 6.

Figure 7:
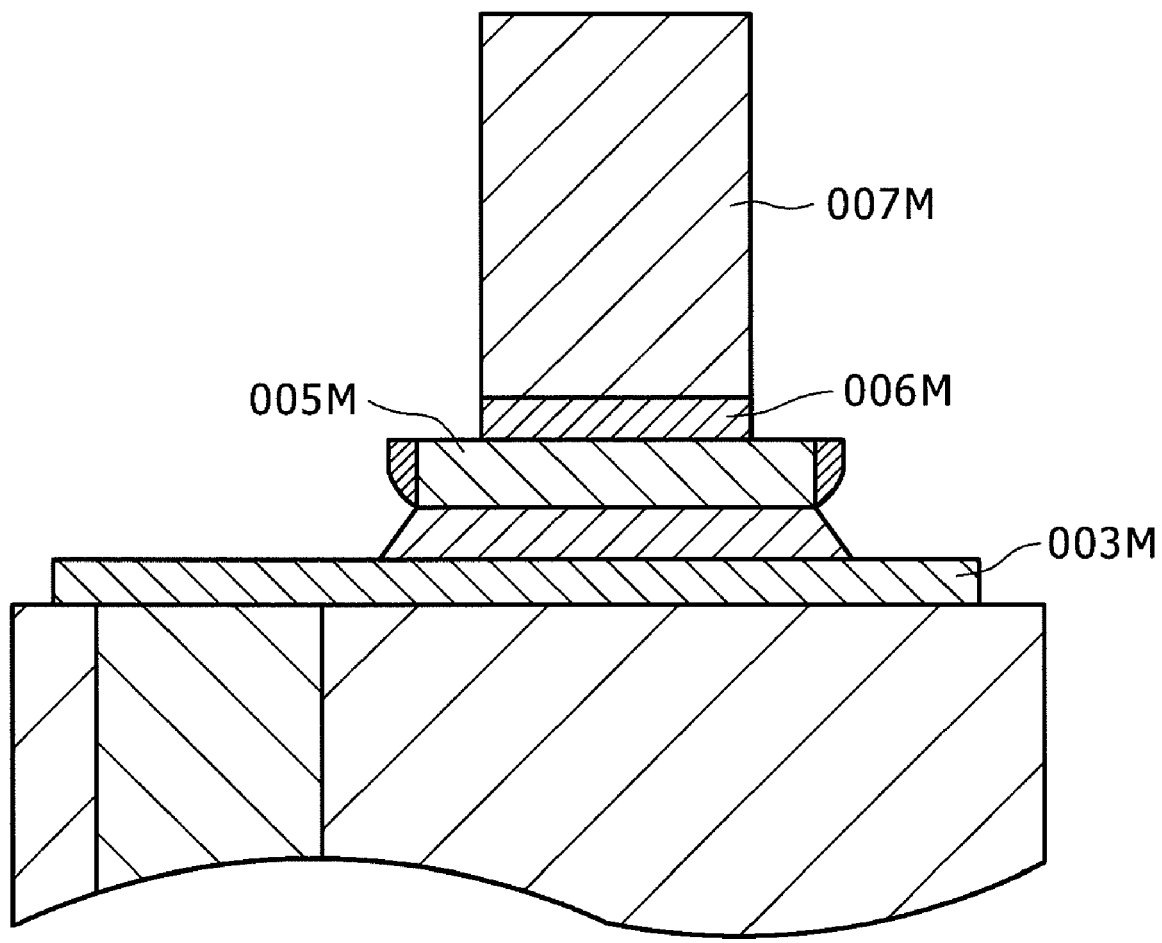
FIG. 7 is a cross sectional view for explaining a manufacturing step according to the first embodiment of the present invention.

FIG. 7 is a cross sectional view showing a state in which the first side wall spacers 009W are removed from the state of FIG. 6. If the first side wall spacers 009W are formed using a silicon-oxide film, the first side wall spacers 009W can be melted by hydrofluoric acid cleaning. At this time, the redepositions 010 redeposited onto the surfaces of the first side wall spacers 009W lose supporting members, and are detached and dropped. Accordingly, it is possible to produce a state in which the redepositions are not present on the side walls of the hard mask conductive material layer 007M. Further, unnecessary portions of the lower electrode conductive layer 003 (first conductive layer) are removed by using a normal lithography technique and a normal etching technique to form a lower electrode layer 003M.

Figure 8:
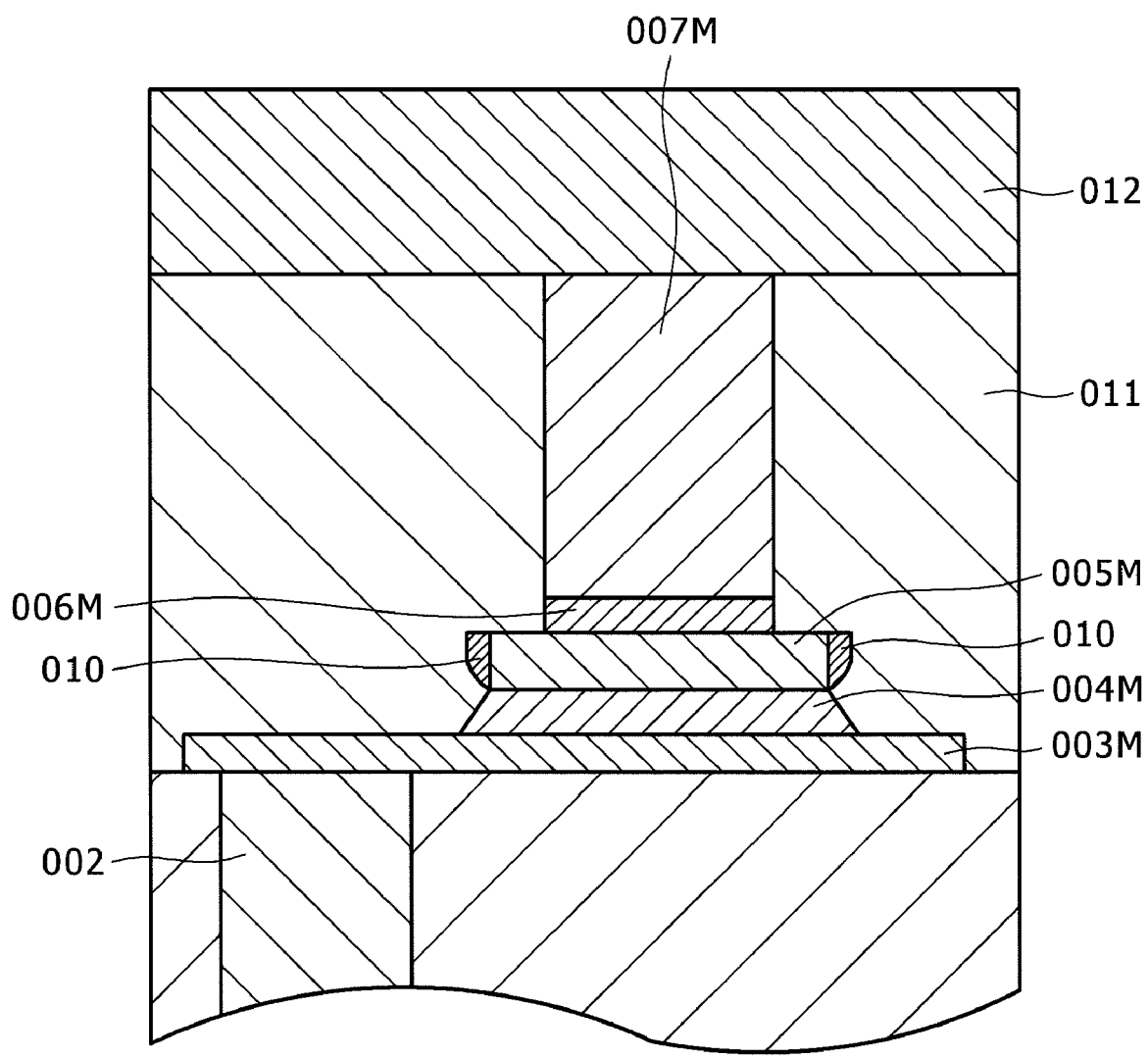
FIG. 8 is a cross sectional view for explaining a manufacturing step according to the first embodiment of the present invention.

FIG. 8 is a diagram in which CMP is performed after an interlayer dielectric film 011 is deposited on the entire surface of FIG. 7, an upper surface of the hard mask conductive material film 007M (fourth conductive layer) is exposed, and the wiring layer 012 (fifth conductive layer) is formed. Since the redepositions are not present on the side walls of the hard mask conductive material film 007M, it is possible to prevent contamination of a CMP device caused by the TMR material. Further, it is possible to prevent short-circuit from the side walls of the TMR laminated film to the wiring 012 caused by the redepositions. The plug electrode 002 is coupled to the lower electrode layer 003M. Accordingly, in the lower electrode layer 003M, the TMR laminated film 004M, and the upper electrode layer 005M which constitute a magnetic memory, the lower electrode layer 003M is coupled to the plug electrode 002, and the upper electrode layer 005M is coupled to the wiring 012 through the intermediate conductive layer 006 and the hard mask conductive material layer 007.

The redepositions 010 slightly remain on the side walls of the upper electrode layer 005M. However, the redepositions are deposited onto the side walls of the extremely thin layer of the upper electrode layer 005M and are covered with the interlayer dielectric film 011, which causes no essential effects. As described in the conventional example, the redepositions do not affect the wiring 012.

Next, a second embodiment will be described using FIG. 9 to FIG. 16. This embodiment relates to a manufacturing method in which unlike the first embodiment, the redepositions can be removed by ion milling using the first and second side wall spacers, without using the intermediate conductive layer. As similar to the first embodiment, the second embodiment shows a step of wiring for a magnetic memory using a magnetic material that is a main point of the present invention. Such a magnetic memory using a magnetic material is mounted for use on a semiconductor device or a semiconductor integrated circuit. As similar to the first embodiment, it is apparent that a special substrate can be prepared in the second embodiment, and a substrate itself of a conventional silicon semiconductor integrated circuit device can be used. Accordingly, the description of the manufacturing method of the silicon semiconductor integrated circuit device itself, other than a wiring portion for the magnetic memory, will be omitted in the present invention. It should be noted that a representative example of the structure of the semiconductor integrated circuit device according to the present invention as well as the semiconductor integrated circuit will be exemplified later.

The followings are basic steps of the second embodiment. Specifically, the second embodiment provides a manufacturing method of a magnetic memory including the steps of: forming a first conductive layer, a laminated film having a magnetic memory function, a second conductive layer, and a fourth conductive layer on a substrate; processing the fourth conductive layer into a predetermined shape; forming a first side wall spacer material layer while covering at least the processed fourth conductive layer and an upper surface of the second conductive layer adjacent to the fourth conductive layer; forming a second side wall spacer material layer on the first side wall spacer material layer; forming first side wall spacers and second side wall spacers after areas of the first side wall spacer material layer and the second side wall spacer material layer corresponding to side walls of the fourth conductive layer are left and the remainder is removed; forming undercut shapes between the first and second side wall spacers and the second conductive layer after removing at least parts of lower end portions of the first side wall spacers relative to the substrate; etching the second conductive layer and the laminated film having a magnetic memory function by ion milling using the fourth conductive layer, the first side wall spacers and the second side wall spacers as mask areas; removing the second side wall spacers as well as the first side wall spacers formed on the side walls of the fourth conductive layer; forming a dielectric film on a surface of the substrate prepared in the above-described steps; exposing, after the dielectric film is planarized by polishing, the fourth conductive layer on an upper surface of the dielectric film; and forming a fifth conductive layer which is electrically coupled to at least the fourth conductive layer.

As described above, it is an important point in the step of forming the first side wall spacers and the second side wall spacers that the first side wall spacers and the second side wall spacers are formed in such a manner that lower ends of the second side wall spacers are mounted on upper portions of areas where the first side wall spacers extend on the second conductive layer.

Further, a semiconductor substrate on which a semiconductor integrated circuit is formed, and on the surface of which a conductive layer coupled to the semiconductor integrated circuit is exposed is prepared to perform the above-described step. Accordingly, it is possible to manufacture the semiconductor integrated circuit device related to the present invention. This is all the same as the case of the first embodiment.

As similar to the case of the first embodiment, there will be described a correspondence relation between designations of respective constituent elements in the concrete example that will be described later and those of the basic steps.

semiconductor substrate 000: substrate
plug electrode 014: conductive layer which is electrically coupled to a semiconductor integrated circuit
lower electrode layer 015: first conductive layer
TMR laminated film 016: laminated film having a magnetic memory function
upper electrode layer 017: second conductive layer
hard mask conductive material layer 018: fourth conductive layer
wiring 024: fifth conductive layer The second embodiment is different from the first embodiment in that the first and second side wall spacers are used without using the intermediate conductive layer 006 (third conductive layer). The other matters are the same as the first embodiment unless otherwise specified. Thus, the detailed descriptions of duplications will be omitted.

Figure 9:
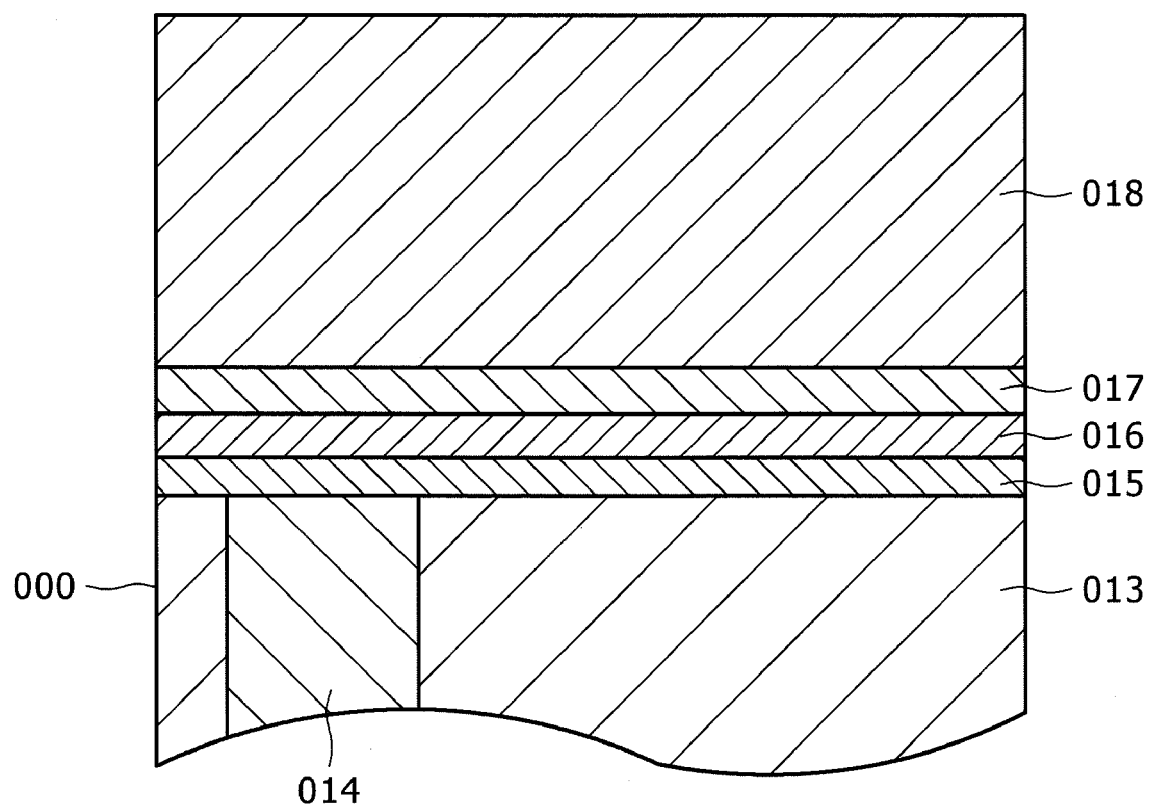
FIG. 9 is a cross sectional view for explaining a manufacturing step according to a second embodiment of the present invention.

FIG. 9 is basically the same as the state of FIG. 1. The lower electrode layer 015, the TMR laminated film 016, the upper electrode layer 017, and the hard mask conductive material 018 are sequentially laminated and deposited on a silicon-oxide film 013 provided on the semiconductor substrate 000. The reference numeral 014 denotes a plug electrode penetrating through the silicon-oxide film 013, and W is generally used as a main material. The silicon-oxide film 013 is a silicon-oxide film formed by CVD (chemical vapor deposition), and corresponds to an inter-wiring-layer film of the semiconductor integrated circuit device. Further, upper surfaces of the silicon-oxide film 013 and the plug electrode 014 are planarized using a normal CMP (Chemical Mechanical Polishing) technique.

For the first conductive layer corresponding to the material of the lower electrode layer 015, at least one selected from a group of Ta, W, TiN, and Ru can be used. For the second conductive layer corresponding to the upper electrode layer 017, the above-described materials are generally used.

For the material of the fourth conductive layer corresponding to the material of the hard mask conductive material 018, at least one selected from a group of Ta, W, and TiN can be used. It should be noted that Ru that is not suitable for a step of exposing an electrode surface by CMP is not used. For the fifth conductive layer, the above-described materials are generally used.

The thicknesses of the first conductive layer, the second conductive layer, and the fourth conductive layer are the same as those described in the first embodiment. Further, the thickness of the TMR laminated film (laminated film having a magnetic memory function) is the same.

Figure 10:
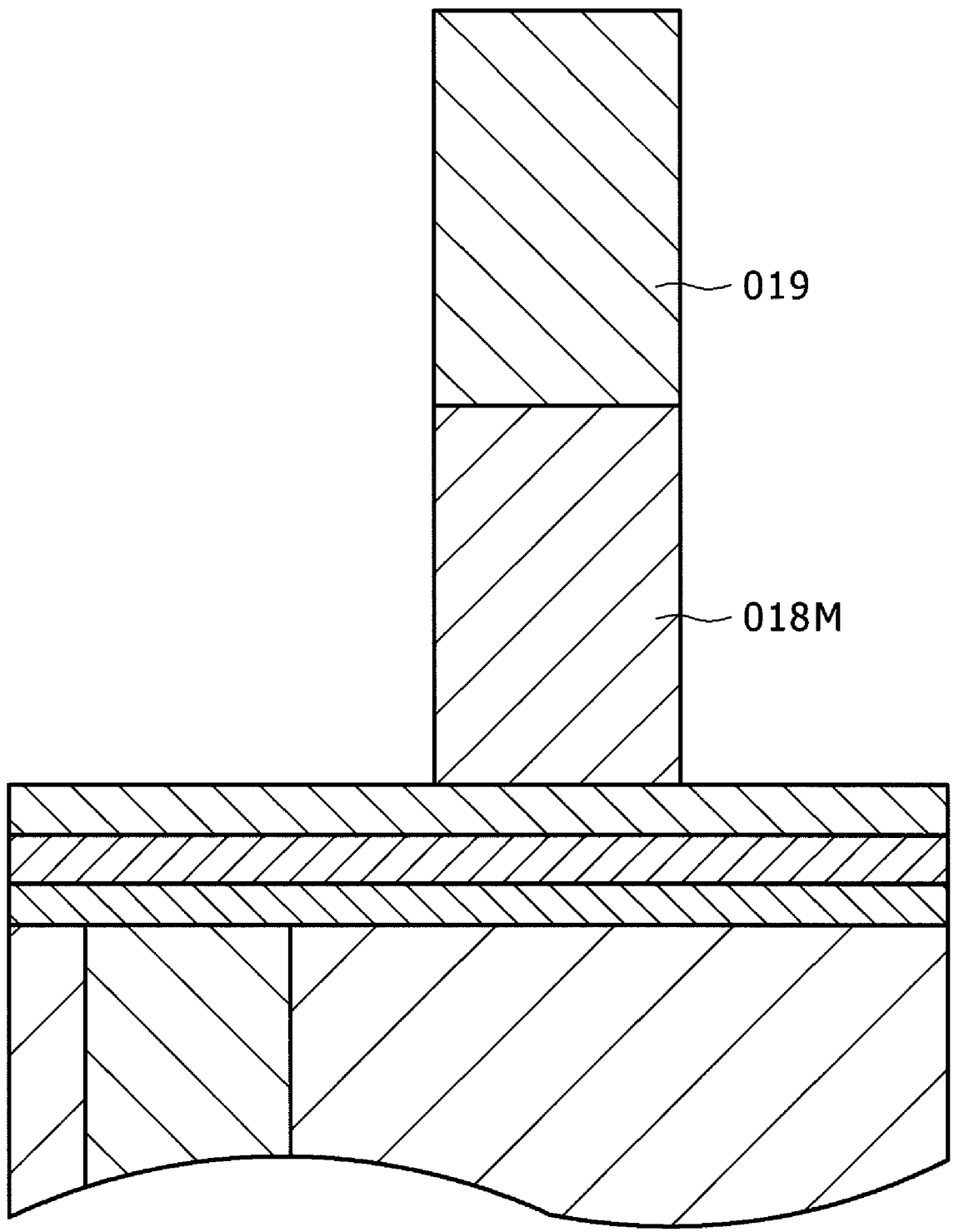
FIG. 10 is a cross sectional view for explaining a manufacturing step according to the second embodiment of the present invention.

FIG. 10 shows a first step for processing a magnetic memory that is one of the targets to which the present invention is applied. FIG. 10 shows a state in which the state of FIG. 9 is processed using a normal lithography technique. The hard mask conductive material 018 is processed to be shaped as a hard mask conductive material film 018M by a normal dry etching technique using a resist layer (normal photo resist layer) 019 as a mask.

Figure 11:
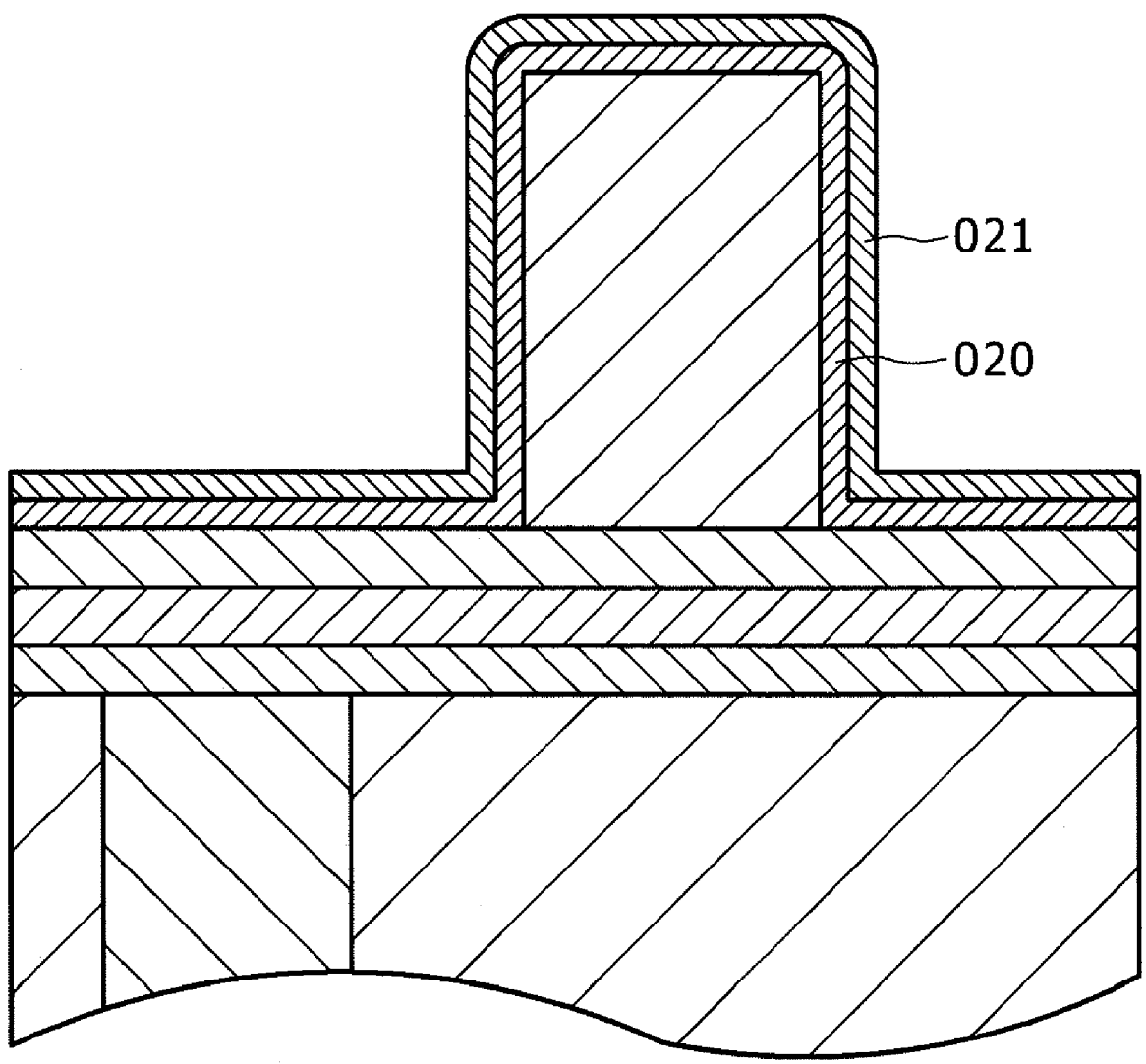
FIG. 11 is a cross sectional view for explaining a manufacturing step according to the second embodiment of the present invention.

FIG. 11 is a cross sectional view in which after the resist mask 019 is removed, a silicon-oxide film 020 corresponding to a first spacer material and a silicon nitride film 021 corresponding to a second spacer material are deposited on the entire surface. The thicknesses of the silicon-oxide film 020 and the silicon nitride film 021 fall within ranges of 5 to 30 nm and 5 to 10 nm, respectively. The thicknesses thereof are set at, for example, 30 nm and 5 nm. The laminating order becomes important in the following steps.

Figure 12:
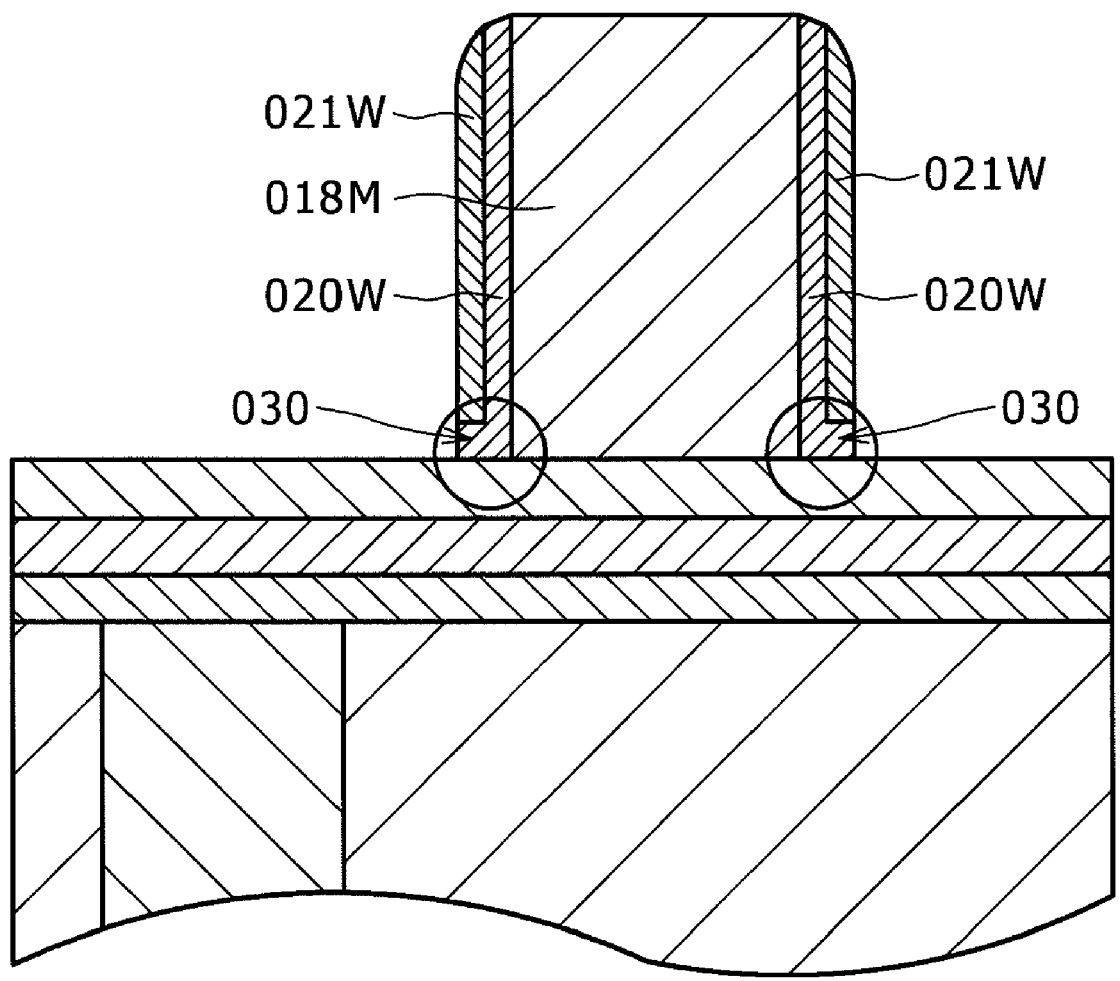
FIG. 12 is a cross sectional view for explaining a manufacturing step according to the second embodiment of the present invention.

FIG. 12 shows a state in which anisotropic dry etching is performed at the stage of FIG. 11 where the silicon-oxide film 020 and the silicon nitride film 021 are deposited, and first spacers 020W and second spacers 021W are formed on side walls of the hard mask conductive material film 018M. In this case, it is essential that layers 030 of the first side wall spacers 020W remain under the second side wall spacers 021W. Specifically, the first side wall spacers and the second side wall spacers are formed in such a manner that lower ends of the second side wall spacers are mounted on upper portions of areas where the first side wall spacers extend on the second conductive layer (the upper electrode layer in the embodiment).

Figure 13:
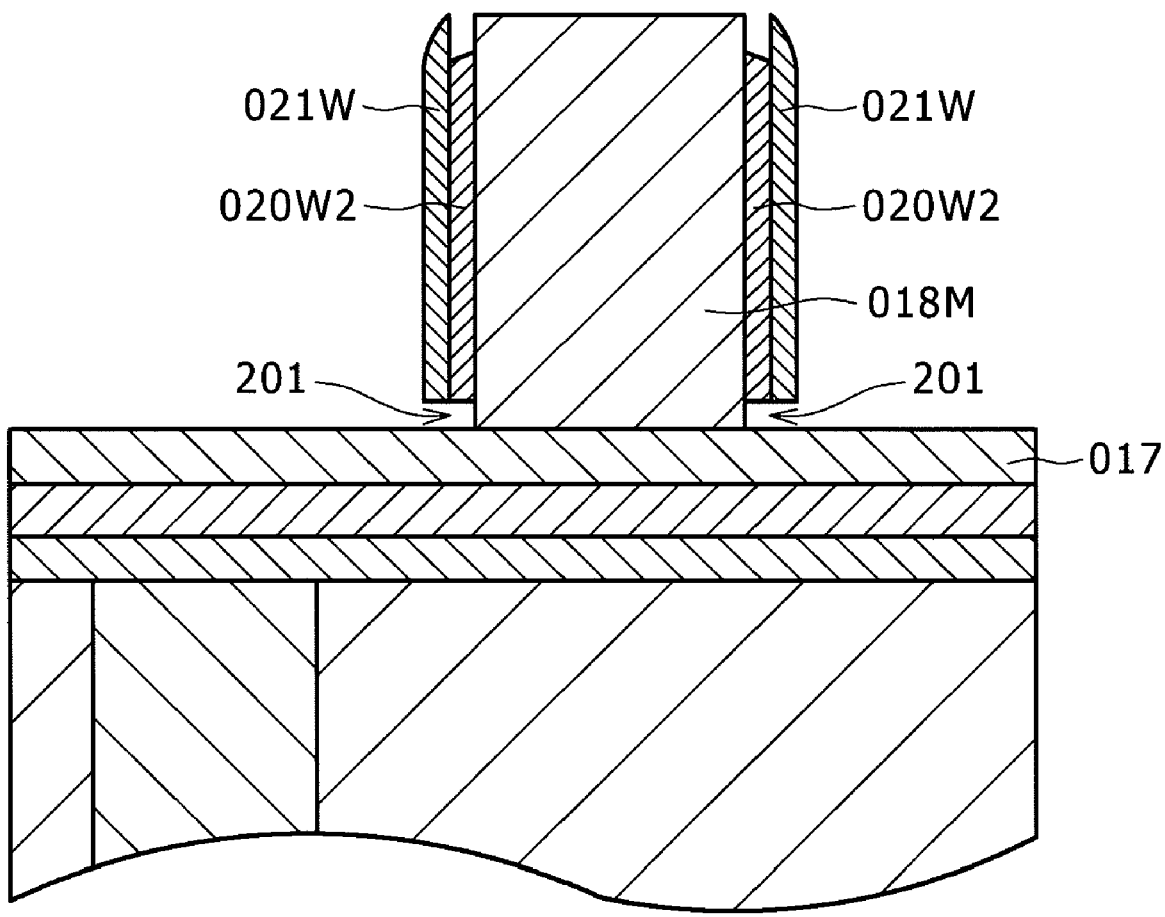
FIG. 13 is a cross sectional view for explaining a manufacturing step according to the second embodiment of the present invention.

FIG. 13 shows a diagram in which isotropic etching is performed for removing the silicon-oxide films 020W in the structure at the stage of FIG. 12, resulting in the shapes of second side wall spacers 020W2. Specifically, upper end portions and lower end portions of the first side wall spacers 020W2 are etched. Each of the silicon-oxide film is removed by 35 nm in the embodiment. By performing such etching, deep undercuts 201 are formed immediately below the first spacers 020W and the second spacers 021W so that the hard mask conductive material film 018W is exposed. In order to form the undercuts 201 which are important in the present invention, it is only necessary to etch at least lower end portions of the first side wall spacers 020W2. However, isotropic etching is performed for the silicon-oxide film 020W in general, and thus, the upper end portions and the lower end portions thereof are etched as shown in FIG. 13.

Figure 14:
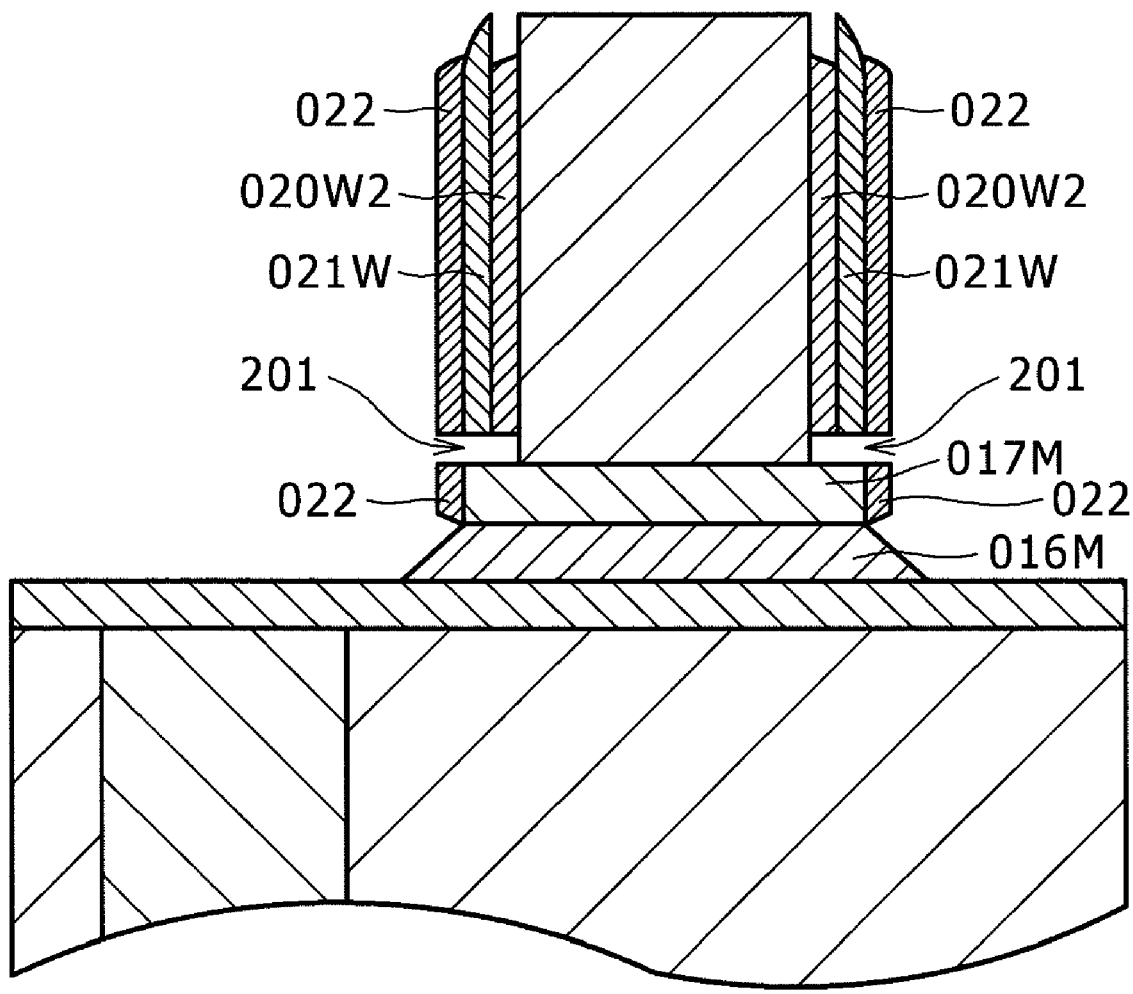
FIG. 14 is a cross sectional view for explaining a manufacturing step according to the second embodiment of the present invention.

FIG. 14 shows a state in which the TMR laminated film 016 and the upper electrode layer 017 are processed by ion milling using the hard mask conductive material film 018M, the first spacers 020W2, and the second spacers 021W as mask areas at the stage of FIG. 13. As similar to the first embodiment, the TMR laminated film 016 is obliquely processed by an ion milling method to be shaped as a TMR layer processed film 016M, and the upper electrode layer 017 is perpendicularly processed to be shaped as an upper electrode film 017M. Redepositions 022 generated when the upper electrode layer 017 is processed by ion milling are divided on the side walls of the upper electrode film 017M and the side walls of the second spacers 021W by the undercuts 201 formed in FIG. 13.

Figure 15:
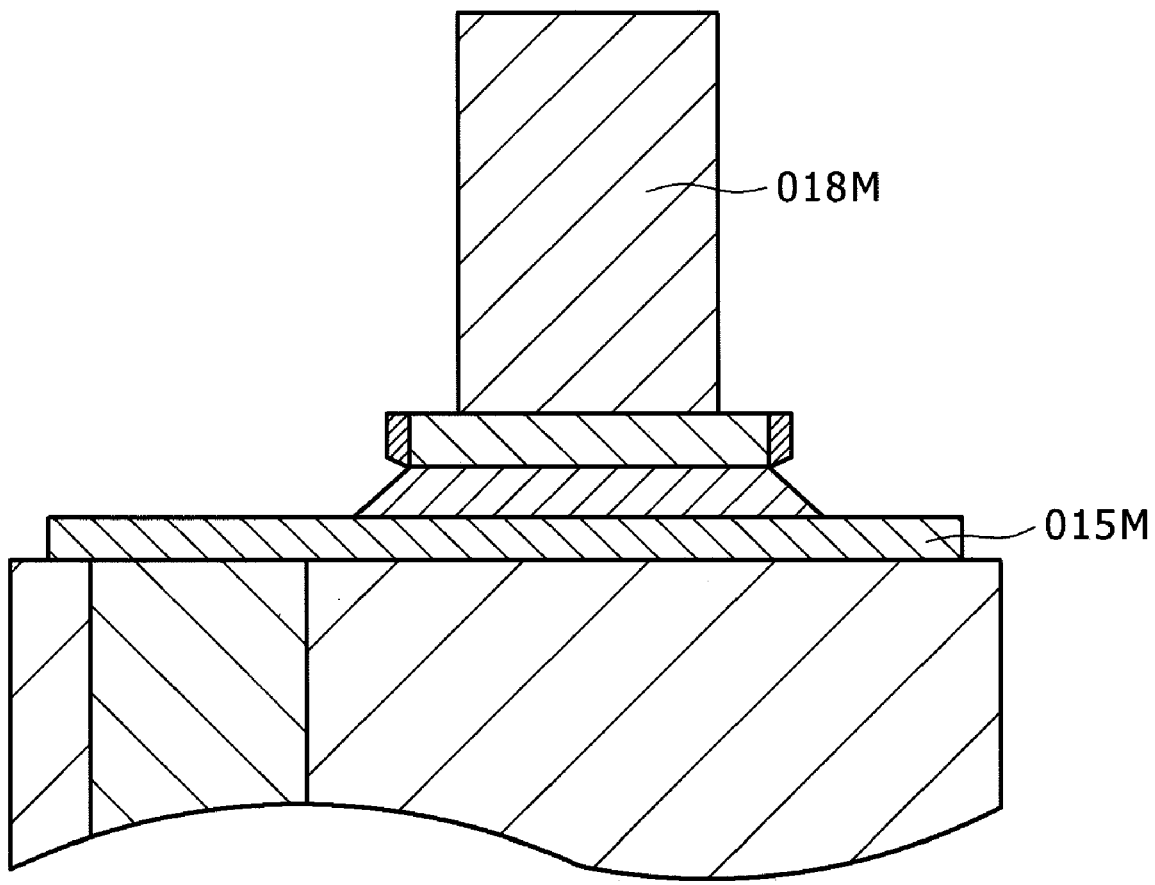
FIG. 15 is a cross sectional view for explaining a manufacturing step according to the second embodiment of the present invention.

FIG. 15 is a diagram showing a state in which the structure at the stage of FIG. 14 is etched by hydrofluoric acid and the first side wall spacers 020W2 are removed. If the layers 020W (first side wall spacers 020W2 to be formed later) are formed using silicon-oxide film, it is possible to melt the first side wall spacers 020W2 by hydrofluoric acid cleaning. At this time, the redepositions 022 redeposited onto the surfaces of the second side wall spacers 021W lose supporting members, and are detached and dropped. Accordingly, it is possible to produce a state in which the redepositions 022 are not present on the side walls of the hard mask conductive material film 018M. Further, unnecessary portions of the lower electrode layer 015 are removed to form a lower electrode layer 015M by etching of a normal lithography technique.

Figure 16:
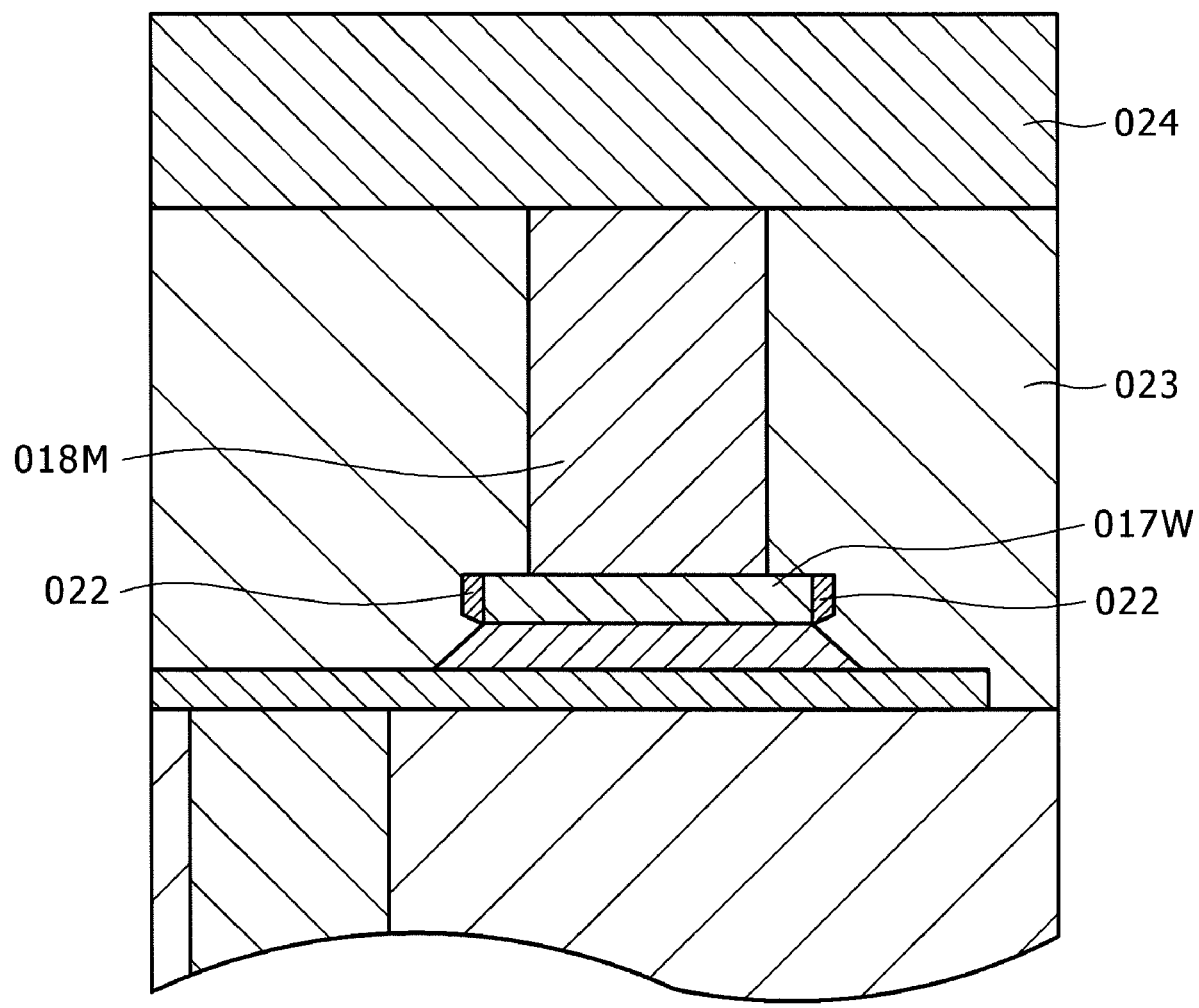
FIG. 16 is a cross sectional view for explaining a manufacturing step according to the second embodiment of the present invention.

FIG. 16 is a cross sectional view of the element in which CMP is performed after an interlayer dielectric film 023 is deposited on the entire surface of the substrate at the stage of FIG. 15, an upper surface of the hard mask conductive material film 018M is exposed, and the wiring layer 024 is formed. Since the redepositions are not present on the side walls of the hard mask conductive material film 018M, it is possible to prevent contamination of a CMP device caused by the TMR material. Further, it is possible to prevent short-circuit from the side walls of the TMR laminated film 016M to the wiring 024 caused by the redepositions.

As similar to the case of the first embodiment, the redepositions 022 slightly remain on the side walls of the upper electrode layer 017M. However, the redepositions are deposited onto the side walls of the extremely thin layer of the upper electrode layer 017M and are covered with the interlayer dielectric film 023, which causes no essential effects. As described in the conventional example, the redepositions do not affect the wiring 024.

As similar to the first embodiment, the plug electrode 014 is coupled to the lower electrode layer 015M. Accordingly, in the lower electrode layer 015M, the TMR laminated film 016M, and the upper electrode layer 017M which constitute a magnetic memory, the lower electrode layer 015M is coupled to the plug electrode 014, and the upper electrode layer 017M is coupled to the wiring 024 through the hard mask conductive material layer 018M.

Next, two concrete examples of structures in which the magnetic memory of the present invention is mounted on a semiconductor integrated circuit device.

Figure 17:
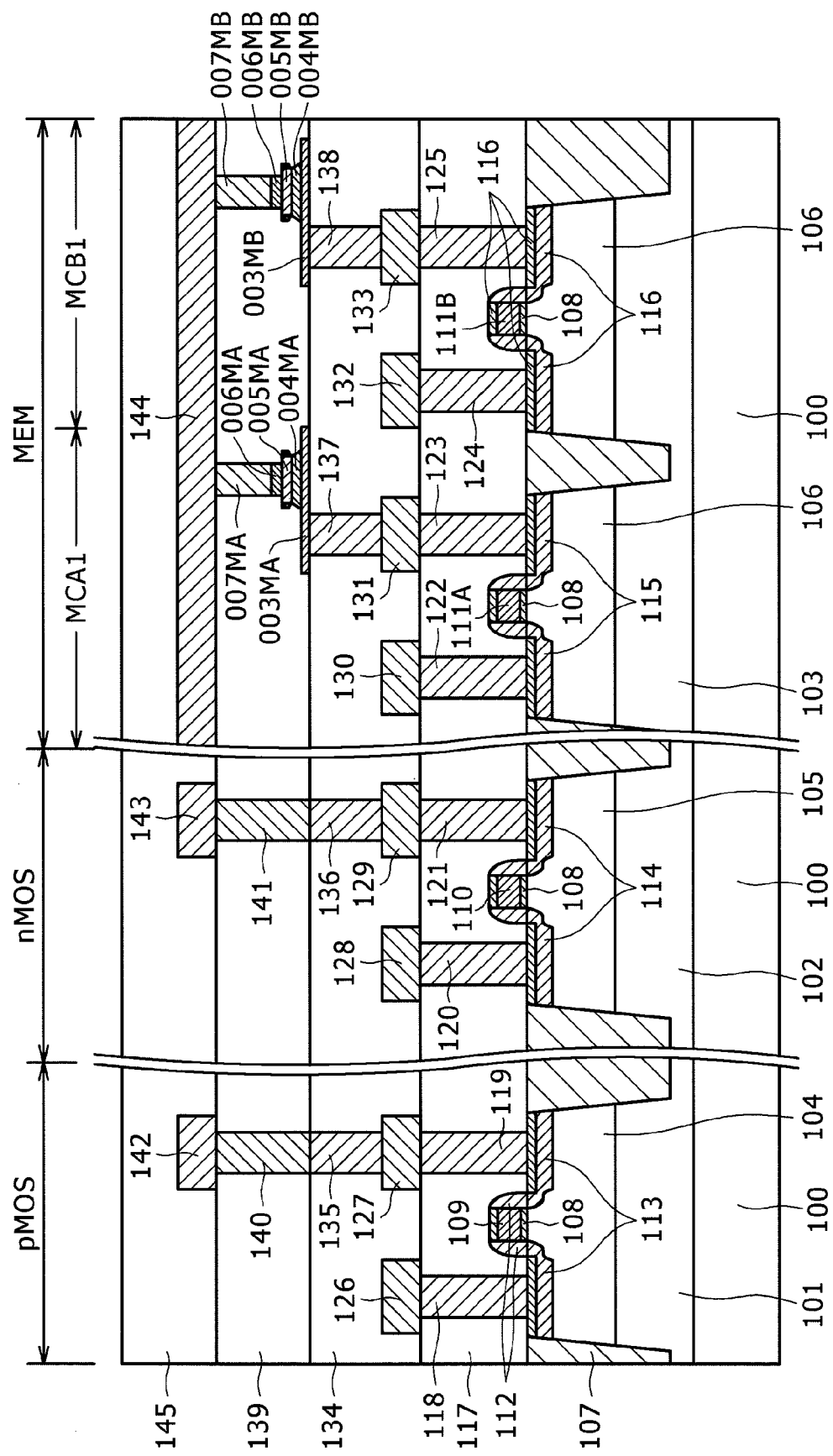
FIG. 17 is a cross sectional view of an example in which a magnetic memory according to the first embodiment of the present invention is applied to a semiconductor integrated circuit device.

FIG. 17 is a cross sectional view schematically showing a case in which the magnetic memory according to the first embodiment of the present invention is applied to a CMOS semiconductor integrated circuit device. In FIG. 17, there are shown a p-type MOSFET area pMOS, an n-type MOSFET area nMOS, an n-type MOSFET, and an area where an integrated area MEM of memory cells composed of magnetic memories is present. The respective constituent elements will be described below.

There are formed a silicon substrate 100, a deep n-type well 101 of the pMOS, a deep p-type well 102 of the nMOS, a deep p-type well 103 of the memory area, a shallow n-type well 104 of the p-type MOS, a shallow p-type well 105 of the n-type MOS, a shallow p-type well 106 of the memory area, and shallow-groove element separation areas 107.

In four wells separated by the shallow-groove element separation areas 107, the respective MOSFETs are formed. Specifically, the pMOS area, the nMOS area, and areas of memory cells MCA1 and MCB1 in the memory cell area are shown. For each MOSFET, a gate dielectric film 108 of each MOSFET, a p-type gate electrode 109 of the pMOS, an n-type gate electrode 110 of the nMOS, an n-type gate electrode 111A of the memory cell MCA1, an n-type gate electrode 111B of the memory cell MCB1, dielectric film spacers 112 formed on side walls of each gate electrode, diffusion layers 113 of the pMOS, diffusion layers 114 of the nMOS, n-type diffusion layers 115 of the MCA1, and n-type diffusion layers 116 of the MCB1 are shown.

A first inter-wiring-layer dielectric film 117 is formed for the MOSFETs, and a source plug 118 of the pMOS, a drain plug 119 of the pMOS, a source plug 120 of the nMOS, a drain plug 121 of the nMOS, a source plug 122 of the MCA1, a drain plug 123 of the MCA1, a source plug 124 of the MCB1, and the drain plug 125 of the MCB1 are formed while penetrating through the first inter-wiring-layer dielectric film 117.

Further, on the first inter-wiring-layer dielectric film 117, a first source wiring layer 126 of the pMOS, a first drain wiring layer 127 of the pMOS, a first source wiring layer 128 of the nMOS, a first drain wiring layer 129 of the nMOS, a first source wiring layer 130 of the MCA1, a first drain wiring layer 131 of the MCA1, a first source wiring layer 132 of the MCB1, and a first drain wiring layer 133 of the MCB1 are arranged and formed.

A second interlayer dielectric film 134 is formed while covering these source wiring layers and drain wiring layers. Four plugs of a second drain plug 135 of the pMOS, a second drain plug 136 of the nMOS, a second drain plug 137 of the MCA1, and a second drain plug 138 of the MCB1 are formed while penetrating through the second interlayer dielectric film 134.

A third interlayer dielectric film 139 is formed on these plugs. Two plugs of a second drain plug 140 of the pMOS and a second drain plug 141 of the nMOS are arranged in the pMOS area and the nMOS area, respectively, and two hard mask conductive layers 007MA and 007MB are arranged in the MEM area while penetrating through the third interlayer dielectric film 139.

On the upper portions thereof, a second drain wiring layer 142 of the pMOS, a second drain wiring layer 143 of the nMOS, and a bit line 144 are formed. As an uppermost layer, an uppermost inter-wiring-layer dielectric film 145 is formed.

The above-described structure is the same as that of the CMOS, and may be manufactured in accordance with the manufacturing method of the CMOS. Accordingly, the detailed description will be omitted.

The followings are the characteristics of the embodiment. FIG. 17 shows an example in which the magnetic memory is arranged in each of the MCA1 and the MCB1. For the magnetic memory MCA1, a lower electrode 003MA of one magnetic memory is electrically coupled to the second drain plug 137, and a TMR laminated film 004MA, an upper electrode layer 005MA, an intermediate conductive layer 006MA, and a hard mask conductive layer 007MA are arranged on the above. As similar to the above, for the MCB1, a lower electrode 003MB is electrically coupled to the second drain plug 138 of the MCB1, and a TMR laminated film 004MB, an upper electrode layer 005MB, an intermediate conductive layer 006MB, and a hard mask conductive layer 007MB are arranged on the above. The drain plugs 007MA and 007MB are coupled to the same bit line 144. The layer of the n-type gate electrode 111A described above functions as a word line of the MCA1, and the layer of the n-type gate electrode 111B functions as a word line of the MCB1. The structure shown in FIG. 17 is an example in which the magnetic memory described in the first embodiment of the present invention is mounted on a CMOS semiconductor integrated circuit device.

Figure 18:
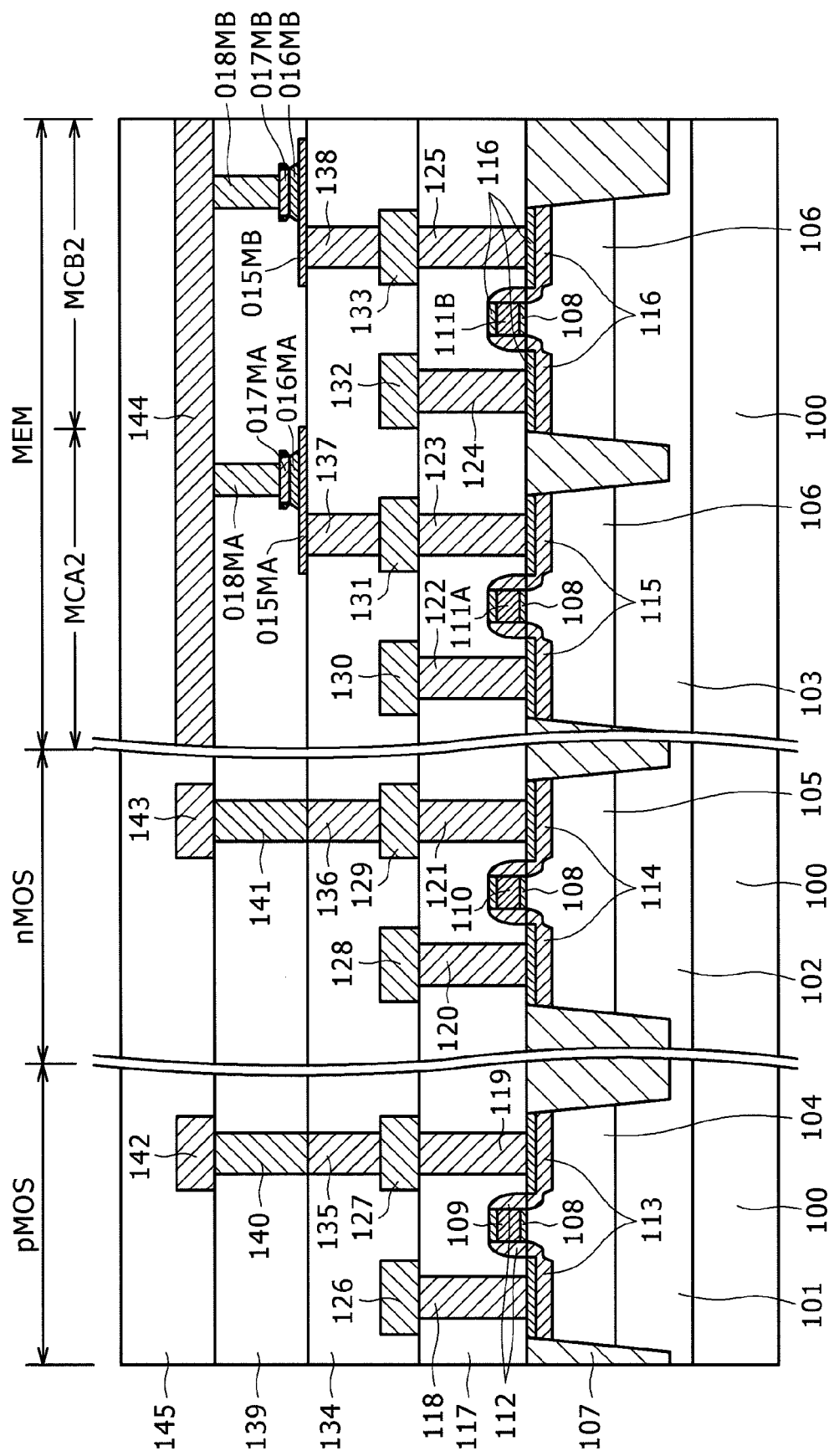
FIG. 18 is a cross sectional view of an example in which a magnetic memory according to the second embodiment of the present invention is applied to a semiconductor integrated circuit device.
Figure 19:
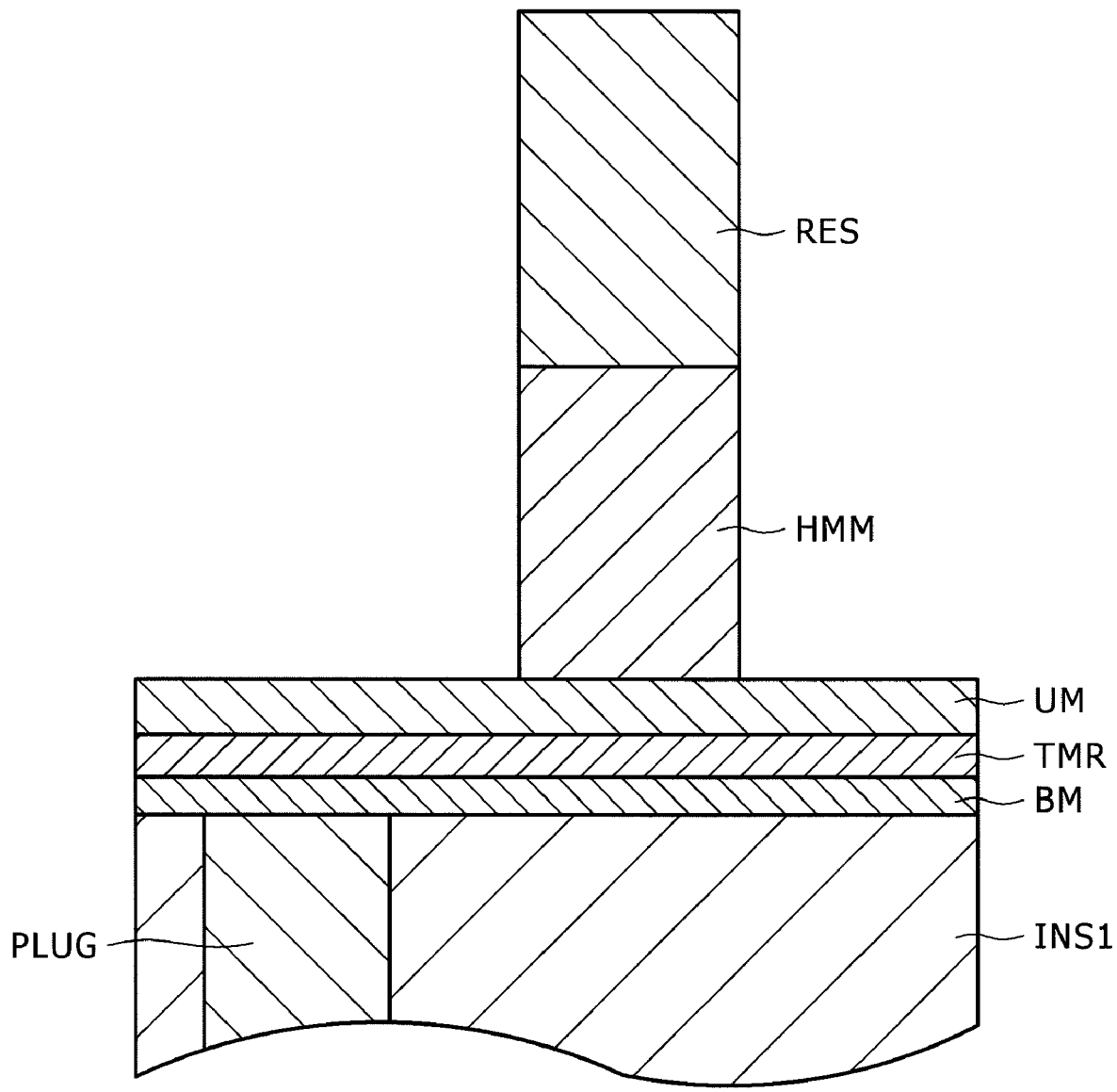
FIG. 19 is a cross sectional view for exemplifying a manufacturing method of a conventional magnetic memory.
Figure 20:
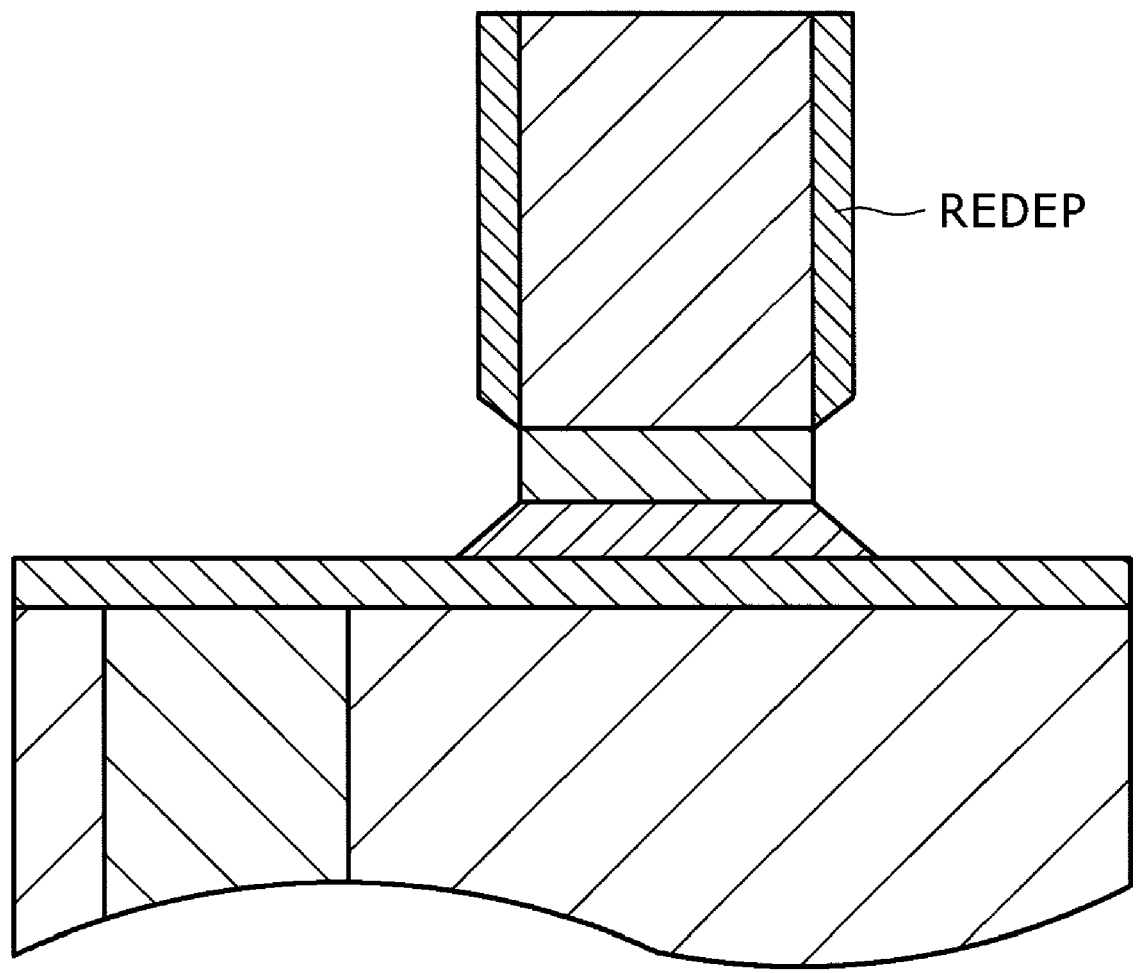
FIG. 20 is a cross sectional view for exemplifying a manufacturing method of the conventional magnetic memory.
Figure 21:
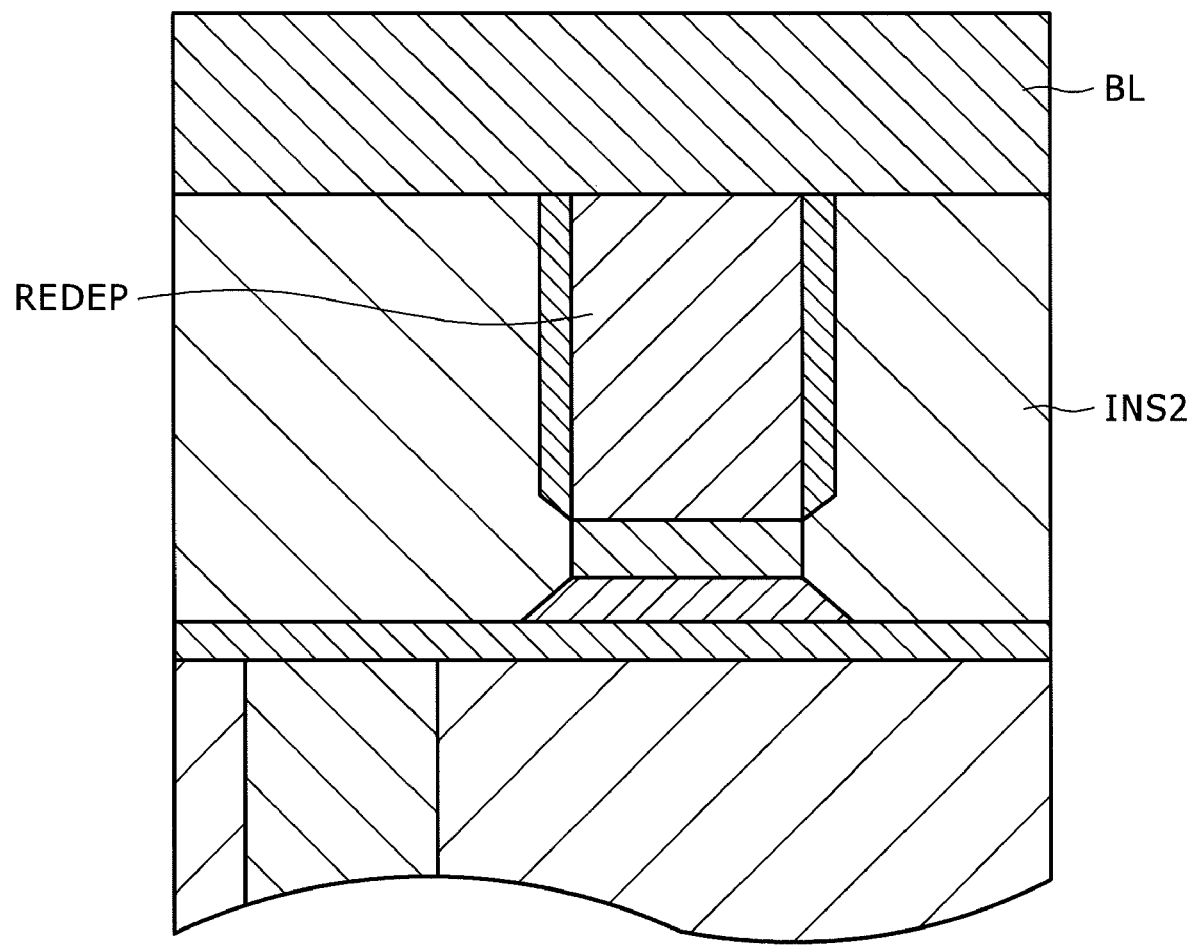
FIG. 21 is a cross sectional view for exemplifying a manufacturing method of the conventional magnetic memory.

FIG. 18 is a cross sectional view schematically showing a case in which the second embodiment of the present invention is applied to a CMOS semiconductor integrated circuit device. The basic configuration of the CMOS portion is the same as FIG. 17, and thus, the descriptions for the reference numerals 100 to 144 are omitted. In a memory cell MCA2 composed of one magnetic memory and one n-type MOSFET, a lower electrode 015MA of the magnetic memory is arranged so as to be electrically coupled to the second drain plug 137 of the MCA2. On the second drain plug 137, a TMR laminated film 016MA, an upper electrode 017MA, and a hard mask conductive layer 018MA are arranged. As similar to the above, for the memory cell MCB2, a lower electrode 015MB of the magnetic memory is arranged so as to be electrically coupled to the drain plug 138 of the MCB2. On the second drain plug 138 of the MCB2, a TMR laminated film 016MB, an upper electrode 017MB, and a hard mask conductive layer 018MB are arranged. The structure shown in FIG. 18 is an example in which the magnetic memory described in the second embodiment of the present invention is mounted on a CMOS semiconductor integrated circuit device.

According to an aspect of the present invention, the redepositions on the side walls generated by ion milling can be prevented, and thus, the prevention of contamination of a semiconductor manufacturing device can be promised. Accordingly, it is possible to realize stable manufacturing of a semiconductor integrated circuit device on which a magnetic memory is mounted.

<Explanations of Letters or Numerals>

Silicon oxide layer: 001, plug electrode which goes through the silicon oxide layer 001: 002, lower electrode layer: 003, TMR laminated film: 004, upper electrode layer: 005, hard mask conductive material layer: 007, resist: 008, hard mask conductive material layer after processing: 007M, silicon oxide layer 009, first side wall spacer formed by processing silicon oxide layer 009: 009W, intermediate conductive layer which is the remainder of layer 006: 006M, upper electrode layer formed by processing the layer 005: 005M, TMR laminated film formed by processing the layer 004: 004M, redepositions: 010, finished lower electrode conductive layer: 003M, wiring: 012, silicon oxide layer: 013, plug electrode: 014, lower electrode layer: 015, TMR laminated film: 016, upper electrode layer: 017, hard mask conductive material layer: 018, resist: 019, hard mask conductive material layer formed by processing the layer 018: 018M, silicon oxide layer: 020, silicon nitride layer: 021, first side wall spacer: 020W, second side wall spacer: 021W, second side wall spacer formed by further processing the spacer 020W: 020W2, TMR laminated film formed by processing the layer 016: 017M, finished lower electrode layer: 015M, interlayer dielectric film: 023, wiring: 024, p-type MOSFET region: pMOS, n-type MOSFET area: nMOS, integrated area of memory cells: MEM, silicon substrate: 100, deep n-type well of pMOS: 101, deep p-type well of nMOS: 102, deep p-type well of memory area: 103, shallow n-type well of p-type MOS: 104, shallow p-type well of n-type MOS: 105, shallow p-type well of memory area: 106, shallow-groove element separation area: 107, gate dielectric film of each MOSFET: 108, p-type gate electrode of pMOS: 109, n-type gate electrode of nMOS: 110, n-type gate electrode of the memory cell MCA1: 111A, n-type gate electrode of the memory cell MCB1: 111B, dielectric film spacer formed on the side wall of gate electrode: 112, diffusion layer of p-MOS: 113, diffusion layer of n-MOS: 114, n-type diffusion layer of MCA1: 115, n-type diffusion layer of MCB1: 116, first inter-wiring-layer dielectric film: 117, source plug of pMOS: 118, drain plug of pMOS: 119, source plug of n-MOS: 120, drain plug of n-MOS: 121, source plug of MCA1: 122, drain plug of MCA1: 123, source plug of MCB1: 124, drain plug of MCB1: 125, first source wiring layer of pMOS: 126, first drain wring layer of nMOS: 127, first source wiring layer of n-MOS: 128, first drain wiring layer of nMOS: 129, first source wiring layer of MCA1: 130, first drain wiring layer of MCA1: 131, first source wiring layer of MCB1: 132, first drain wiring layer of MCB1: 133, second interlayer dielectric film: 134, second drain plug of pMOS: 135, second drain plug of nMOS: 136, second drain plug of MCA1: 137, second drain plug of MCB1: 138, third interlayer dielectric film: 139, second drain plug of pMOS: 140, second drain plug of nMOS: 141, second drain wring layer of pMOS: 142, second drain wiring layer of nMOS: 143, uppermost inter-wiring-layer dieiectric film: 145, lower electrode of magnetic memory arranged in MCA1: 003MA, TMR laminated film arranged in MCA1: 004MA, upper electrode layer arranged in MCA1: 005MA, intermediate conductive layer arranged in MCA1: 006MA, hard mask conductive layer arranged in MCA1: 007MA, lower electrode of magnetic memory arranged in MCB1: 003MB, TMR laminated film arranged in MCB1: 004MB, upper electrode layer arranged in MCB1: 005MBA, intermediate conductive layer arranged in MCB1: 006MB, hard mask conductive layer arranged in MCB1: 007MB, lower electrode of magnetic memory arranged in MCA2: 015MA, TMR laminated film arranged in MCA2: 016MA, upper electrode layer arranged in MCA2: 0017MA, hard mask conductive layer arranged in MCA2: 018MA, lower electrode of magnetic memory arranged in MCB2: 015MB, TMR laminated film arranged in MCB2: 016MB, upper electrode layer arranged in MCB2: 0017MB, hard mask conductive layer arranged in MCB2: 018MB.

What is claimed is:

1. A manufacturing method of a magnetic memory comprising:

sequentially forming a first conductive layer, a laminated film having a magnetic memory function, a second conductive layer, a third conductive layer, and a fourth conductive layer on a substrate;

processing the fourth conductive layer into a predetermined shape;

forming a first side wall spacer material layer while covering at least the processed fourth conductive layer;

forming first side wall spacers while the first side wall spacer material layers formed on side walls of the fourth conductive layer are left and the remainder is removed;

forming undercut shapes under the first side wall spacers while removing areas of the third conductive layer exposed on an upper surface of the substrate prepared in the above-described steps and areas corresponding to lower portions of the first side wall spacers;

etching the second conductive layer and the laminated film having a magnetic memory function by ion milling using the fourth conductive layer and the first side wall spacers as mask areas;

removing the first side wall spacers formed on the side walls of the fourth conductive layer;

forming a dielectric film on the surface of the substrate prepared in the above-described steps;

exposing, after the dielectric film is planarized by polishing, the processed fourth conductive layer on an upper surface of the dielectric film; and forming a fifth conductive layer which is electrically coupled to at least the fourth conductive layer.

2. The manufacturing method of a magnetic memory according to claim 1, wherein the first side wall spacer material layer is a silicon-oxide film.

3. The manufacturing method of a magnetic memory according to claim 1, wherein the third conductive layer is a conductive layer by which the second and fourth conductive layers can be selectively removed.

4. A manufacturing method of a magnetic memory comprising:

forming a first conductive layer, a laminated film having a magnetic memory function, a second conductive layer, and a fourth conductive layer on a substrate;

processing the fourth conductive layer into a predetermined shape;

forming a first side wall spacer material layer while covering at least the processed fourth conductive layer and an upper surface of the second conductive layer adjacent to the fourth conductive layer;

forming a second side wall spacer material layer on the first side wall spacer material layer;

forming, after areas of the first side wall spacer material layer and the second side wall spacer material layer corresponding to side walls of the fourth conductive layer are left and the remainder is removed, first side wall spacers and second side wall spacers in such shapes that lower ends of the second side wall spacers are mounted on upper portions of areas where the first side wall spacers extend on the second conductive layer;

forming undercut shapes between the first and second side wall spacers and the second conductive layer after removing parts of upper end portions and lower end portions of the first side wall spacers relative to the substrate;

etching the second conductive layer and the laminated film having a magnetic memory function by ion milling using the fourth conductive layer, the first side wall spacers and the second side wall spacers as mask areas;

removing the second side wall spacers as well as the first side wall spacers formed on the side walls of the fourth conductive layer;

forming a dielectric film on a surface of the substrate prepared in the above-described steps;

exposing, after the dielectric film is planarized by polishing, the fourth conductive layer on an upper surface of the dielectric film; and forming a fifth conductive layer which is electrically coupled to at least the fourth conductive layer.

5. The manufacturing method of a magnetic memory according to claim 4, wherein
the first side wall spacer material layer is a silicon-oxide film, and the second side wall spacer material layer is a silicon nitride film.

6. The manufacturing method of a magnetic memory according to claim 4, wherein
the material of the first side wall spacers can selectively remove the material of the second side wall spacers.

7. A manufacturing method of a semiconductor integrated circuit device comprising:

preparing a semiconductor substrate in which a semiconductor integrated circuit is formed and on a surface of which a conductive layer electrically coupled to the semiconductor integrated circuit is exposed;

forming a first conductive layer, a laminated film having a magnetic memory function, a second conductive layer, a third conductive layer, and a fourth conductive layer on the semiconductor substrate while covering at least the conductive layer exposed on the surface of the semiconductor substrate;

processing the fourth conductive layer into a predetermined shape;

forming a first side wall spacer material layer while covering at least the processed fourth conductive layer;

forming first side wall spacers while the first side wall spacer material layers formed on side walls of the fourth conductive layer are left and the remainder is removed;

forming undercut shapes under the first side wall spacers while removing areas of the third conductive layer exposed on an upper surface of the substrate prepared in the above-described steps and areas corresponding to lower portions of the first side wall spacers;

etching the second conductive layer and the laminated film having a magnetic memory function by ion milling using the fourth conductive layer and the first side wall spacers as mask areas;

removing the first side wall spacers formed on the side walls of the fourth conductive layer;

forming a dielectric film on the surface of the substrate prepared in the above-described steps;

exposing, after the dielectric film is planarized by polishing, the processed fourth conductive layer on an upper surface of the dielectric film; and forming a fifth conductive layer which is electrically coupled to at least the fourth conductive layer.

8. The manufacturing method of a semiconductor integrated circuit device according to claim 7, wherein
the first side wall spacer material layer is a silicon-oxide film.

9. The manufacturing method of a semiconductor integrated circuit device according to claim 7, wherein
the third conductive layer is a conductive layer by which the second and fourth conductive layers can be selectively removed.

10. The manufacturing method of a semiconductor integrated circuit device according to claim 7, wherein
the semiconductor integrated circuit includes a complementary MOSFET (CMOS).

11. The manufacturing method of a semiconductor integrated circuit device according to claim 8, wherein the semiconductor integrated circuit includes a complementary MOSFET (CMOS).

12. The manufacturing method of a semiconductor integrated circuit device according to claim 9, wherein
the semiconductor integrated circuit includes a complementary MOSFET (CMOS).

13. A manufacturing method of a semiconductor integrated circuit device comprising:

preparing a semiconductor substrate in which a semiconductor integrated circuit is formed and on a surface of which a conductive layer coupled to the semiconductor integrated circuit is exposed;

forming a first conductive layer, a laminated film having a magnetic memory function, a second conductive layer, and a fourth conductive layer on the semiconductor substrate while covering at least the conductive layer exposed on the surface of the semiconductor substrate;

processing the fourth conductive layer into a predetermined shape;

forming a first side wall spacer material layer while covering at least the processed fourth conductive layer and an upper surface of the second conductive layer adjacent to the fourth conductive layer;

forming a second side wall spacer material layer on the first side wall spacer material layer;

forming, after areas of the first side wall spacer material layer and the second side wall spacer material layer corresponding to side walls of the fourth conductive layer are left and the remainder is removed, first side wall spacers and second side wall spacers in such shapes that lower ends of the second side wall spacers are mounted on upper portions of areas where the first side wall spacers extend on the second conductive layer;

forming undercut shapes between the first and second side wall spacers and the second conductive layer after removing parts of upper end portions and lower end portions of the first side wall spacers relative to the substrate;

etching the second conductive layer and the laminated film having a magnetic memory function by ion milling using the fourth conductive layer, the first side wall spacers and the second side wall spacers as mask areas;

removing the second side wall spacers as well as the first side wall spacers formed on the side walls of the fourth conductive layer;

forming a dielectric film on a surface of the substrate prepared in the above-described steps;

exposing, after the dielectric film is planarized by polishing, the fourth conductive layer on an upper surface of the dielectric film; and forming a fifth conductive layer which is electrically coupled to at least the third conductive layer.

14. The manufacturing method of a semiconductor integrated circuit device according to claim 13, wherein
the first side wall spacer material layer is a silicon-oxide film, and the second side wall spacer material layer is a silicon nitride film.

15. The manufacturing method of a semiconductor integrated circuit device according to claim 13, wherein
the first side wall spacers can selectively remove the second side wall spacers.

16. The manufacturing method of a semiconductor integrated circuit device according to claim 13, wherein
the semiconductor integrated circuit includes a complementary MOSFET (CMOS).

17. The manufacturing method of a semiconductor integrated circuit device according to claim 14, wherein the semiconductor integrated circuit includes a complementary MOSFET (CMOS).

18. The manufacturing method of a semiconductor integrated circuit device according to claim 15, wherein the semiconductor integrated circuit includes a complementary MOSFET (CMOS).

* * * * *